United States Patent
Matsunaga et al.

(10) Patent No.: US 6,242,930 B1
(45) Date of Patent: Jun. 5, 2001

(54) HIGH-FREQUENCY PROBE CAPABLE OF ADJUSTING CHARACTERISTIC IMPEDANCE IN END PART AND HAVING THE END PART DETACHABLE

(75) Inventors: Kouji Matsunaga; Hirobumi Inoue; Masao Tanehashi; Toru Taura; Masahiko Nikaidou, all of Tokyo; Yuuichi Yamagishi, Kanagawa; Satoshi Hayakawa, Kanagawa; Hironori Tsugane, Kanagawa, all of (JP)

(73) Assignees: NEC Corporation; Antritsu Corporation, both of Tokyo (JP)

( * ) Notice: Subject to any disclaimer, the term of this patent is extended or adjusted under 35 U.S.C. 154(b) by 0 days.

(21) Appl. No.: 09/196,953

(22) Filed: Nov. 20, 1998

(30) Foreign Application Priority Data

Nov. 21, 1997 (JP) .................................................. 9-321251
Mar. 16, 1998 (JP) ................................................ 10-065123

(51) Int. Cl.$^7$ ......................................................... G01R 31/02
(52) U.S. Cl. ........................ 324/754; 439/482; 324/755; 324/72.5
(58) Field of Search ..................................... 324/754, 755, 324/762, 158.1, 72.5; 439/482

(56) References Cited

U.S. PATENT DOCUMENTS

| 4,849,689 | 7/1989 | Gleason et al. . | |
|---|---|---|---|
| 5,177,438 | * 1/1993 | Littlebury | 324/158.1 |
| 5,506,515 | * 4/1996 | Godshalk et al. | 324/762 |
| 5,565,788 | * 10/1996 | Burr et al. | 324/762 |
| 6,023,171 | * 2/2000 | Boyette, Jr. et al. | 324/754 |

FOREIGN PATENT DOCUMENTS

| 60-236241 | 11/1985 | (JP) . |
|---|---|---|
| 63-124668 | 8/1988 | (JP) . |
| 64-21309 | 2/1989 | (JP) . |
| 3-158764 | 7/1991 | (JP) . |
| 5-80077 | 3/1993 | (JP) . |
| 6-34715 | 2/1994 | (JP) . |
| 8-233861 | 9/1996 | (JP) . |

OTHER PUBLICATIONS

Japanese Office Action Apr. 25, 2000 and English translation of relevant portions.

* cited by examiner

Primary Examiner—Safet Metjahic
Assistant Examiner—Jimmy Nguyen
(74) Attorney, Agent, or Firm—Ostrolenk, Faber, Gerb & Soffen, LLP

(57) ABSTRACT

In a high-frequency probe having a detachable end according to the present invention, parts relating to replacement of an end unit are three parts, that is, an end unit, a probe body, and a pressure block. The end unit comprises a coaxial cable, two slender plate-like ground plates. The coaxial cable is linear in the direction of the end of the high-frequency probe. The ground plates sandwich the coaxial cable. The probe body has an end unit support surface, a circuit board, an end unit arrangement surface and an end part guide. The end unit support surface forms a perpendicular surface used for fixing the end unit to a predetermined position in the end side of the central block in a central part of a surface of the body block. The circuit board connects the end unit to a coaxial connector. The end unit arrangement surface forms a plane in an end side of the body block. And further the guide groove positions and fixes the ground plate in the end part. It is capable to supply positioning pins and a positioning pin holes in mutual contact surfaces for positioning. The present invention makes it possible to adjust characteristic impedance of the probe end part by providing an elastically-shaped part for securing contact pressure and using a pipe or the ground plate in an exposed part of the coaxial inner conductor for performing gap adjustment.

23 Claims, 24 Drawing Sheets

HIGH-FREQUENCY PROBE CAPABLE OF ADJUSTING CHARACTERISTIC IMPEDANCE IN END PART AND HAVING THE END PART DETACHABLE

BACKGROUND OF THE INVENTION

1. Field of the Invention

The present invention relates to a high-frequency probe for measuring a high-frequency characteristic by pressing one end against a signal electrode and ground electrodes of a device-under-test and connecting an external measuring instrument to another end to input and output electric signals. In particular, the present invention relates to a high-frequency probe capable of adjusting an impedance characteristic in an end part, the end part being detachable.

2. Description of the Related Art

Conventionally, as this type of high-frequency probe, for example, U.S. Pat. No. 4,849,689 proposes a high-frequency probe that is detachable.

A summary of this high-frequency probe will be described with reference to FIG. 1.

In this high-frequency probe, a probe tip 1010 which contacts to a device-under-test is mutually connected to a connector assembly 1022 for external connection, which is attached to a probe body 1021, through a circuit board 1023. The probe tip 1010 has a central signal line or conductor and ground lines or conductors at both sides thereof on a thin plate-like substrate. The circuit board 1023 also has stripline construction where line-shaped ground lines are provided in both sides of the central signal line with the central conductor as the center.

The circuit board 1023 connecting to the connector assembly 1022 for external connection is fitted in a receptacle 1031 formed as a receiving groove on the upper surface of the probe body 1021 and having the same direction as that of the central signal line. In addition, the circuit board 1023 is fitted with the probe tip 1010 at another end, and consequently, forms a high-frequency transmission line with the central signal and ground lines. Furthermore, the circuit board 1023 is pressed by a pressure block 1040 from the upper direction when the circuit board 1023 is fitted in the receptacle 1031 by an absorber 1024. This absorber 1024 arranges boundary conditions of the transmission line and shields the influence of an external magnetic field.

The pressure block 1040 holds a dielectric compressor bar 1041 and a compression member 1042 and is fitted with stud 1032 of the probe body 1021 using screws. When the circuit board 1023 is pressed by the pressure block 1040, the dielectric compressor bar 1041 not only presses the probe tip 1010 against the circuit board 1023 from the upper direction, but also positions the circuit board 1023. The compression member 1042 is an elastic body to securely press against the probe tip 1010, so as to press the probe tip 1010 against the device-under-test.

The conventional high-frequency probe described above has a problem in that much effort is needed to replace the probe tip, thus requiring many working hours.

The reason for this is that many parts must be disassembled and reassembled, and the parts are small. An example will be described with reference to FIG. 1. First, by removing the pressure block 1040, at this time, the dielectric compressor bar 1041 and the compression member 1042 are removed. Next, by removing the circuit board 1023 and absorber 1024 from the receptacle 1031, the circuit board 1023 and absorber 1024 are separated. Subsequently, the probe tip 1010 fitted with the circuit board 1023 is removed. On the other hand, in assembly, a reverse procedure is performed. In a process like this, careful operation is required because there is a possibility of dropping the dielectric compressor bar 1041, the compression member 1042, and the like around the operation area when they are removed.

Next, an end part 1110 of the probe tip (1010 in FIG. 1) will be described with reference to FIG. 2.

The end part 1110 is an example of an end part of a chip conductor, and has a central signal conductor 1111 and ground conductors 1112 on both sides thereof. These conductors connect to the central signal line and ground lines of the circuit board described above, respectively, and are arranged on the same plane.

As exemplified in FIG. 3A, in a device-under-test 2100 arranged on a surface of a device stage 3000, the height of the signal electrode 2111 provided on the surface as a coplanar electrode is equal to that of the ground electrodes 2112 provided on both sides thereof. On the other hand, in the case shown in FIG. 3B, the height of the central signal electrode 2111B is greater than that of ground electrode 2112 provided on both sides thereof. In this manner, usually, the height of the electrodes arranged in a line is varied.

On the other hand, as shown in FIG. 4A, so as to absorb any height difference between a signal electrode 2111 and ground electrodes 2112 of a device-under-test 2100, only the central signal conductor 1111 in the end part 1110 of the high-frequency probe that is exemplified in FIG. 3A has elasticity. Therefore, in the end part 1110, usually, the central signal conductor 1111, as shown in the drawing, is positioned on the side to be pressed against the device and the central signal conductor 1111 bends with the elasticity according to the height of the signal electrode 2111 when the central signal conductor 1111 contacts to a device-under-test 2100. Therefore, as shown in FIG. 4B, the central signal conductor 1111 contacts the signal electrode 2111 with elastic pressure when the ground conductors 1112 at both sides thereof contact the ground electrodes 2112 of the device-under-test 2100.

In addition, in the high-frequency probe described above, if a ground electrode of the device-under-test is not on the same plane as a signal electrode and is provided instead on the entire surface of the backside of the device, the ground electrodes of the high-frequency probe cannot contact the ground electrodes of the device-under-test. In this case, an alternative method is adopted, wherein the device-under-test is mounted on a board and an end of the high-frequency probe is made to contact measurement electrodes provided on the board.

In addition, conventionally, characteristic impedance of a high-frequency probe is matched in 50Ω of impedance in a transmission line of the entire probe.

In consequence, the conventional high-frequency probe described above is problematic in that product cost becomes expensive.

This problem arises because the end parts for contacting respective lines of a device-under-test are arranged in a coplanar construction on the same plane; hence, it is necessary to provide ground electrodes adjacent to a signal electrode of the device-under-test within a predetermined space. Thus, this causes the external size of the device-under-test to become large. In particular, in a compound device such as a GaAs whose wafer cost is expensive, the number of chips per wafer becomes small, and therefore cost increase is not avoidable. On the other hand, in the case of the device-under-test that is down-sized by providing the ground electrode on the entire surface of the backside, the measurement electrodes are provided on the board, and the device-under-test is mounted on the board to be measured. Therefore, a defective rate as a product increases and further repair cost is added.

Furthermore, another problem is that matching of the characteristic impedance in the end part of the high-frequency probe collapses and its high-frequency characteristics become worse.

A height difference between the central signal conductor and ground electrodes arises when the conductors of the end part of the high-frequency probe contact the electrodes of the device-under-test. Furthermore, the height of the electrodes of the device-under-test are different and at least the central signal conductor among the conductors in the end part of the high-frequency probe has elasticity.

Thus, the characteristic impedance of the high-frequency probe, as shown in FIG. 3A, is matched when the central signal conductor 1111 and ground conductors 1112 are on the same plane, and the signal electrode 2111 and two ground electrodes 2112 of the device being tested have the same height. Therefore, in the situation shown in FIG. 3A, the characteristic impedance does not fluctuate. Nevertheless, if there are height differences between electrodes as shown in FIG. 3B, matching of the characteristic impedance collapses and the high-frequency characteristic becomes worse since the central signal conductor 1111 and ground conductors 1112 cannot be positioned on the same plane.

In addition, if the probe end is made to be fixed so as to avoid fluctuation of the characteristic impedance, stable contact cannot be achieved since an overdrive amount at the time of contacting and pressing the electrodes of the device-under-test can be obtained little and hence the amount of pressure applied cannot reach a predetermined amount. On the other hand, adjustment of the overdrive amount in which the predetermined pressure amount can be obtained is very difficult, because it is necessary not to damage the electrodes of the device-under-test 2100.

Thus, in the end part 1110 of the high-frequency probe that is shown in FIG. 4A, the contact surface of the electrodes of the device-under-test 2100 is defined as the positioning datum, and hence any height difference between electrodes of the device-under-test 2100 changes the positional relationship between the central signal conductor 1111 and ground conductors 1112. In consequence, matching of the characteristic impedance in the end part collapses, and the high-frequency characteristic becomes worse. Furthermore, in the example shown in FIG. 4B, there is still another problem in that the ground conductors 1112 cannot stably contact the ground electrodes 2112 since the ground conductors 1112 have no elasticity and hence, producibility of measurement is poor.

Furthermore, as shown in FIG. 5A, if a signal electrode 2111 of a device-under-test 2100 is bonded with a wire 2220, characteristic impedance Z0 is obtained by adding an inductive component L1 of the wire 2220 to the characteristic impedance Z1 of the device-under-test 2100 itself. A normal high-frequency probe 1000 shown in FIG. 5B is adjusted to match this characteristic impedance Z0. Therefore, there is an additional problem in that if a single device-under-test that does not have a wire, as shown in FIG. 5B, is tested, it is difficult to set conditions equivalent to the inductive component L1 of the wire, and hence, accuracy of measurement becomes poor.

SUMMARY OF THE INVENTION

An object of the present invention is to solve the above-mentioned problems and to provide a high-frequency probe whose end portion is detachable, and which can reduce working hours since operation at the time of replacing the probe tip is simple.

In addition, another object is to provide a high-frequency probe having an end part whereby a reproducible excellent high-frequency characteristic can be obtained, even if the positions for contacting the electrodes are varied such as when the height of the electrodes of a device-under-test are nonuniform and the ground electrode is provided on the whole surface of the backside of the device-under-test. Furthermore, the present invention provides a high-frequency probe which can be accurately measured with equivalent characteristic impedance even before the wire-bonding process.

First, the high-frequency probe of the present invention whose end part is detachable is composed of three parts, that is, an end unit, a probe body, and a pressure block. Only these parts are disassembled and reassembled, which simplifies the operation at the time of replacing the probe tip.

The end unit presses a signal electrode and ground electrodes of a device-under-test with one end, has conductors serving as a transmission line for inputting and outputting electric signals to and from another end part, and is detachable from the probe body.

The probe body has a transmission line connecting a transmission cable, which connects to an external measuring instrument and inputs/outputs electric signals, to the transmission line of the end unit. The probe body additionally comprises a part on the end unit positionable for connecting two transmission lines, and an end part guide having a guide groove that determines the position of the end part of the end unit when pressed against the device-under-test.

The pressure block has such construction that the pressure block compresses the end unit fitted on the probe body and electrically connects the conductors which serve as the transmission line of the end unit to the transmission line of the probe body by pressing the former transmission line against the latter transmission line. At this time, the end unit fits in the end part guide of this probe body and the end part positioning part of the probe body.

In addition, so as not only to reduce assembly manhours, but also to further secure positioning of the detachable end unit of the high-frequency probe according to the present invention, the probe body can comprise a support surface and an arrangement surface where the end unit is fitted, and a positioning pin and a locating hole in the probe body and in the end unit respectively.

In addition, in the end unit, so as to obtain an excellent high-frequency characteristic even if the heights of the electrodes of the device-under-test are varied, the transmission line of the end unit is composed of a coaxial cable or the like and two ground parallel plates that are provided on both sides of this coaxial cable or the like. Furthermore, a means for maintaining contact pressure on the guide fixing the ground plates and the ground electrodes of the device-under-test is provided.

The coaxial cable or the like has flexibility, is composed of a central signal conductor and a dielectric holding this central signal conductor at the position of the central axis, and is approximately linearly-shaped.

Two ground plates not only are positioned in parallel on both sides of an exposed part of the central signal conductor contacting the signal electrodes of the device-under-test, but also have a height for forming a sufficient width in the direction of the coaxial cable bending.

In addition, so as to change the characteristic impedance in the end part of the probe, an impedance adjustment member is provided. The impedance adjustment member is constructed to fit in an exposed part of the central signal conductor contacting the signal electrode of the device-under-test, and is selectable for its optional shape and quality of material. Therefore, it is possible to change the characteristic impedance freely by selection of the member or combination of members.

In addition, in the present invention, by the circuit board having a plurality of transmission lines and the end unit having a plurality of transmission lines or a plurality of end units being provided, it becomes easy to perform measurement of a plurality of electrodes forming a line on the same plane of the device-under-test.

DESCRIPTION OF THE PREFERRED EMBODIMENTS

Next, a high-frequency probe having an end part which is detachable according to an embodiment of the present invention will be described with reference to drawings.

Figure 1:
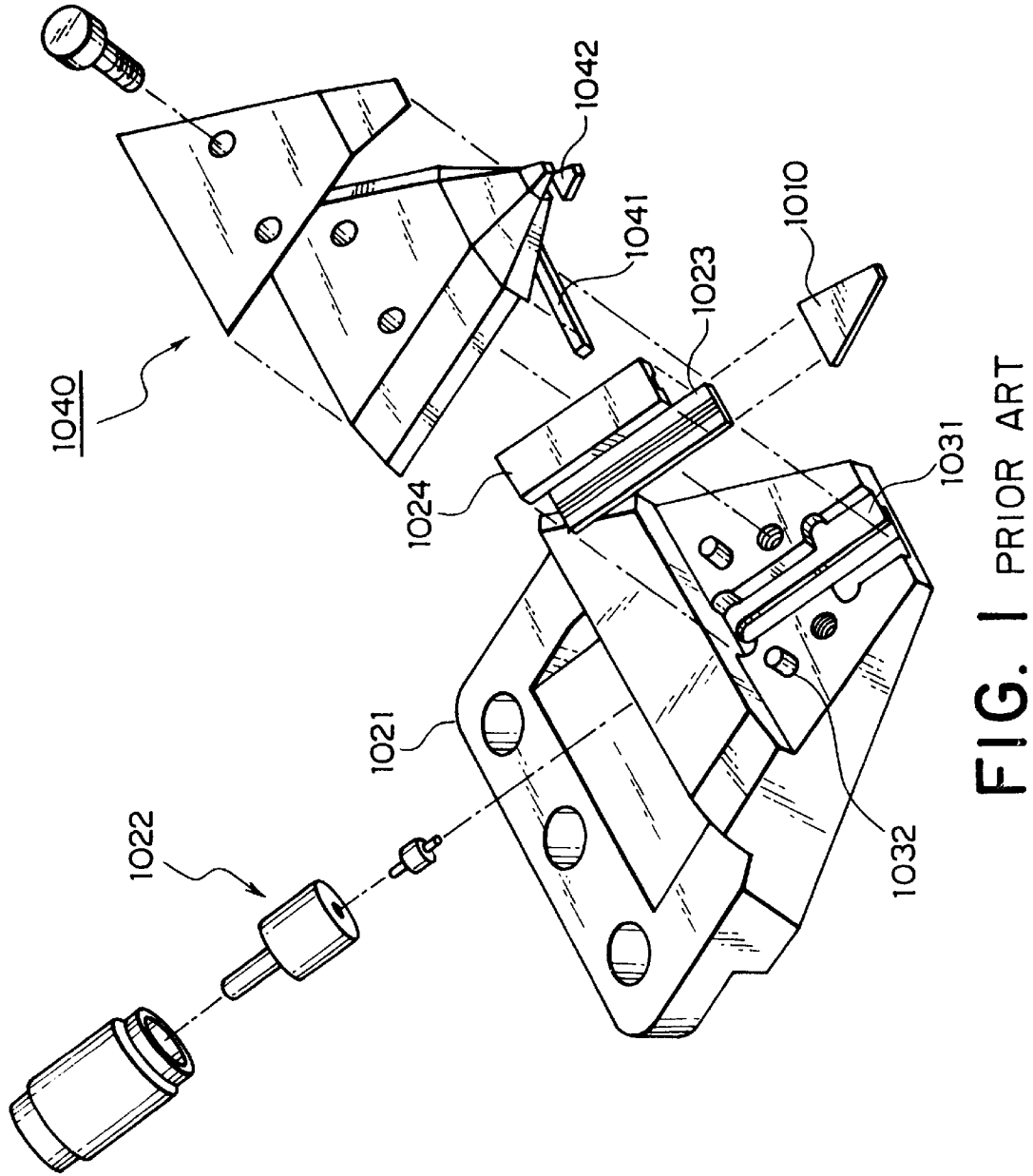
FIG. 1 is an exploded perspective view showing an example of a conventional high-frequency probe in a disassembled state.
Figure 2:
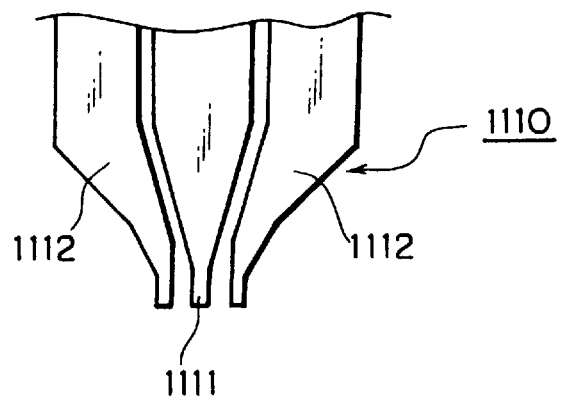
FIG. 2 is a plan view showing an example of an end part of a conventional high-frequency probe.
Figure 3A:
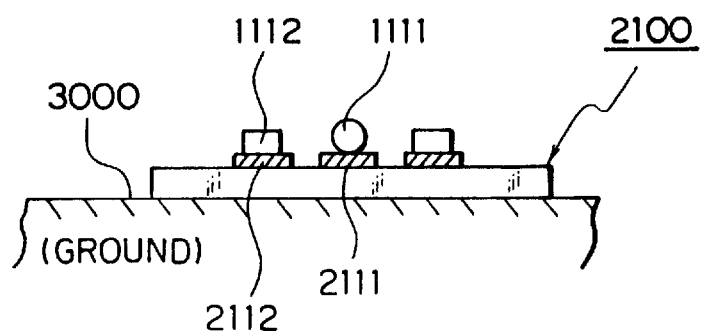
FIG. 3A is a front view showing an example of an end part performing a measurement by a conventional high-frequency probe.
Figure 3B:
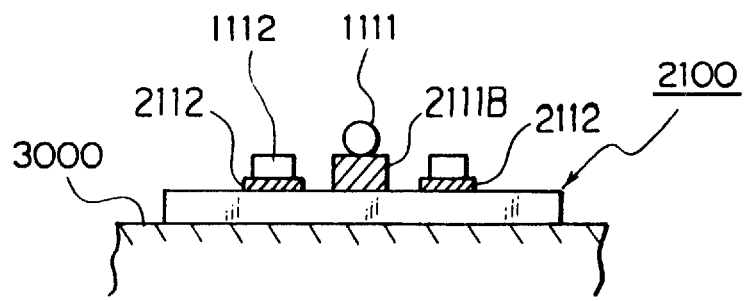
FIG. 3B is a front view showing an example in a case in which the height of the electrodes of a device-under-test is mutually different in FIG. 3A.
Figure 4A:
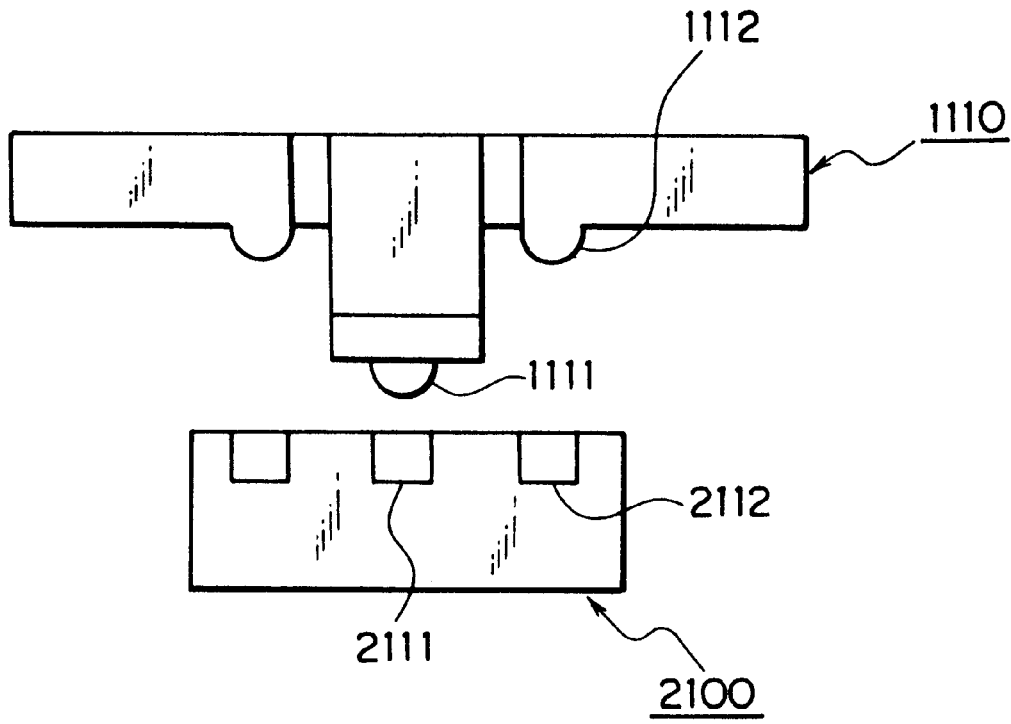
FIG. 4A is a front view showing an example of a conductor position in an end part of a conventional high-frequency probe.
Figure 4B:
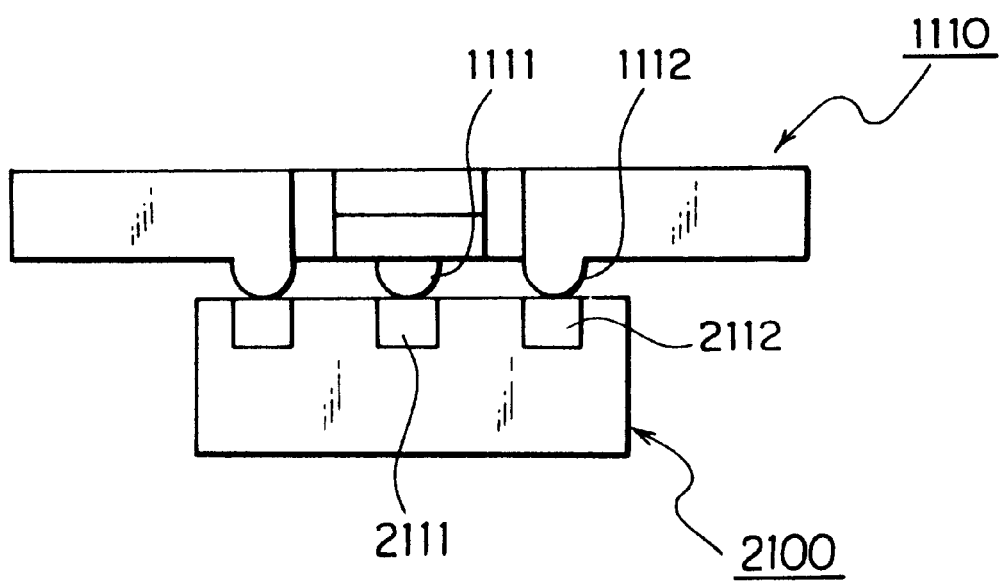
FIG. 4B is a front view showing a state in which the end part contacts the electrodes of the device-under-test in FIG. 4A.
Figure 5A:
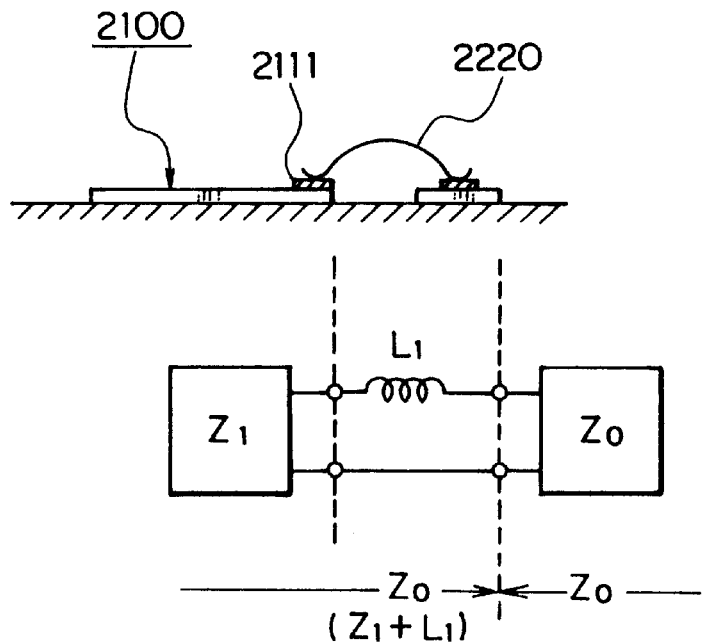
FIG. 5A is a side view showing an example of a wire-bonded signal electrode of a device-under test.
Figure 5B:
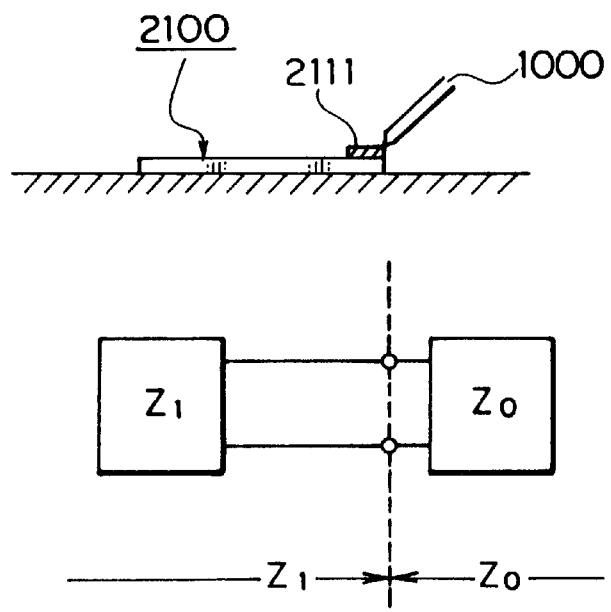
FIG. 5B is a side view showing an example of a probe contacting the signal electrode of the device-under-test.
Figure 6:
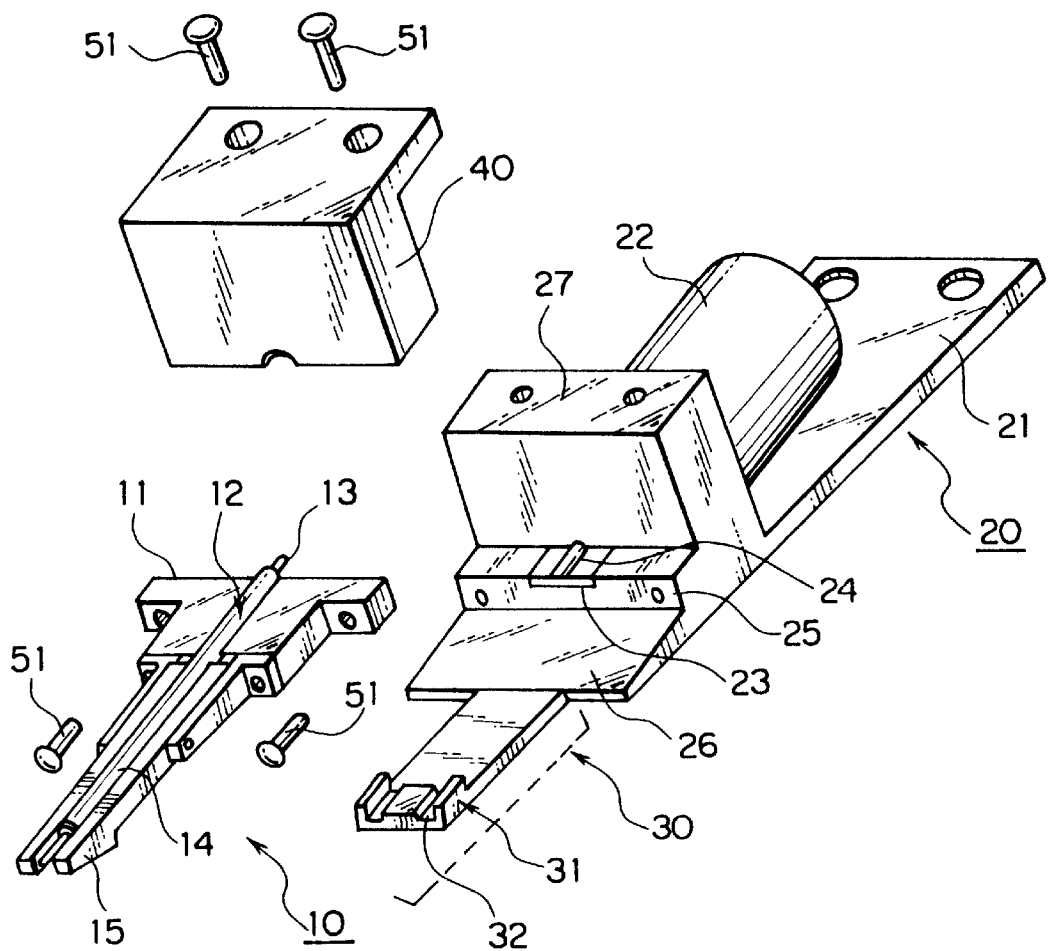
FIG. 6 is an exploded perspective view showing a partial appearance at the time of disassembling an embodiment of the present invention.
Figure 7:
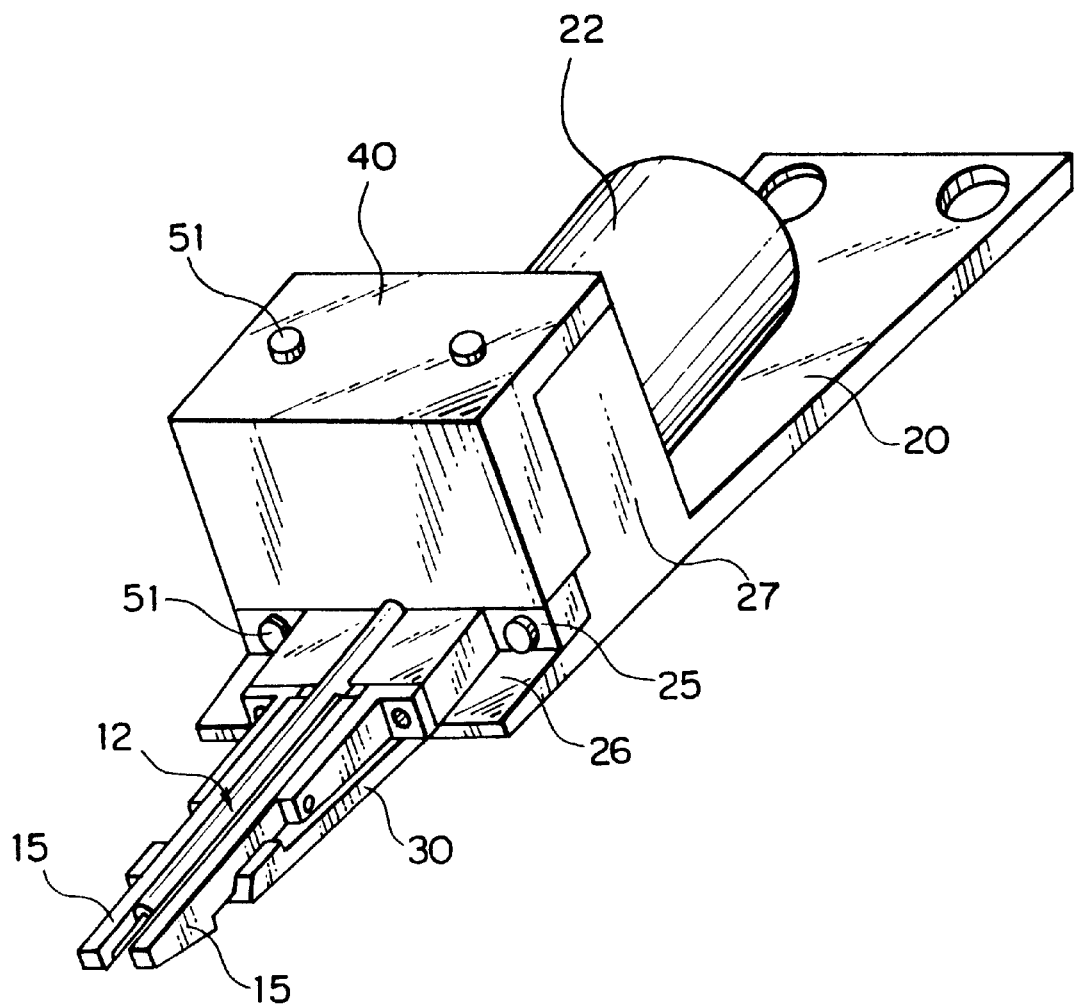
FIG. 7 is a perspective view showing the embodiment shown in FIG. 6 in an assembled state.

FIG. 6 is an exploded perspective view showing a portion of a disassembled probe in an embodiment of the present invention. FIG. 7 is a perspective view showing the probe after completion of assembling the parts shown in FIG. 6. In the high-frequency probe having the detachable end part, parts relating to the replacement of an end unit 10 include three parts, that is, the end unit 10, a probe body 20, and a pressure block 40.

The end unit 10 comprises an end unit block 11 having a thin plate-like shape, a coaxial cable 12, and slender ground plates 15. The coaxial cable 12 is linear along the longitudinal direction of the high-frequency probe that is pressed against a device-under-test. The ground plates 15 are slender and sandwich this coaxial cable 12 by two flat inner surfaces.

One end part of the coaxial cable 12 is pinched by the end unit block 11, and a coaxial inner conductor 13 that becomes a central signal conductor is exposed. In another end part of the coaxial cable 12, two ground plates 15 are mechanically and electrically connected to the end unit block 11. The ground plates 15 are arranged to contact both sides of a coaxial outer conductor 14 that becomes a ground line. The coaxial inner conductor 13 of the coaxial cable 12 is exposed at both its end parts and is arranged as a signal conductor between the ground plates 15.

The end unit block 11 is assembled with the probe body 20. Two surfaces contacting the end unit block 11 and probe body 20 are flat in this embodiment as shown in the figures.

The probe body 20 has a circuit board 23 and a central block 27 in a central part on a surface of the body block 21. The circuit board 23 connects the end unit 10 to a coaxial connector 22 for external connection in a center of the central part, and the central block 27 protrudes on the surface. In this central block 27, the coaxial connector 22 for external connection is mechanically fixed by forming an electrical transmission line with the circuit board 23.

In a region that is nearer to the distal end than the central block 27 of the probe body 20, an end unit support surface 25 and an end unit arrangement surface 26 are provided. The end unit support surface 25 is formed in a plane perpendicular to the coaxial inner conductor 13. In addition, the end unit arrangement surface 26 is formed in a plane contacting a surface of the body block 21 to the backside of the end unit 10. The end unit support surface 25 and end unit arrangement surface 26 are provided for stabilizing the end unit 10 when the end unit 10 is fixed at a predetermined position with screws 51.

In addition, on the end side of the body block 21, distally to the end unit arrangement surface 26, a body end part 30 is formed on which the end side of the end unit 10 is to be arranged. Furthermore, on the end of the body end part 30, an end part guide 31 for positioning is provided. The end part guide 31 fixes the slender ground plates 15 of the end unit 10 when the end unit 10 is fixed at a predetermined position. The end part guide 31 that is shown in the drawing comprises a guide groove 32 where two ground plates 15 can fit from the end direction and upper direction above the surface.

In the probe body 20 shown in FIG. 6, the end unit 10 is secured by screws in a position defined by the end unit support surface 25 and end unit arrangement surface 26. The end unit 10 is fixed on the surface of the body block 21 from the end direction and upper direction above the surface. At the same time, the end unit 10 is also positioned by the guide groove 32 and the body end part 30. At this time, the coaxial inner conductor 13 that is exposed in the end unit 10 overlaps onto an exposed surface of the central signal conductor 24 in the circuit board 23.

The pressure block 40 has such shape that the pressure block 40 may overlay the upper surface of central block 27, and is fixed thereto with screws 51. Due to this fixing, not only the end unit 10 is pressed while in a predetermined position on the body block 21 to become fixed at such position, but also the pressure joint of the coaxial inner conductors 13 and the central signal conductor 24 is completed. Thus, the coaxial inner conductors 13 and the central signal conductor 24 form a signal conductor of a transmission line.

According to the construction described above, since the parts to be disassembled and reassembled are reduced to three parts, that is, the end unit 10, the probe body 20, and the pressure block 40, the number of working hours for disassembly or reassembly can be reduced. In addition, since the end unit 10 is positioned by three locations, that is, the end unit support surface 25, the end unit arrangement surface 26, and guide groove 32, reproducibility of an accurate position can be easily obtained.

Next, a second embodiment will be described with reference to FIG. 8, the embodiment which has an end unit positioning part different from that of the first embodiment described above.

Figure 8:
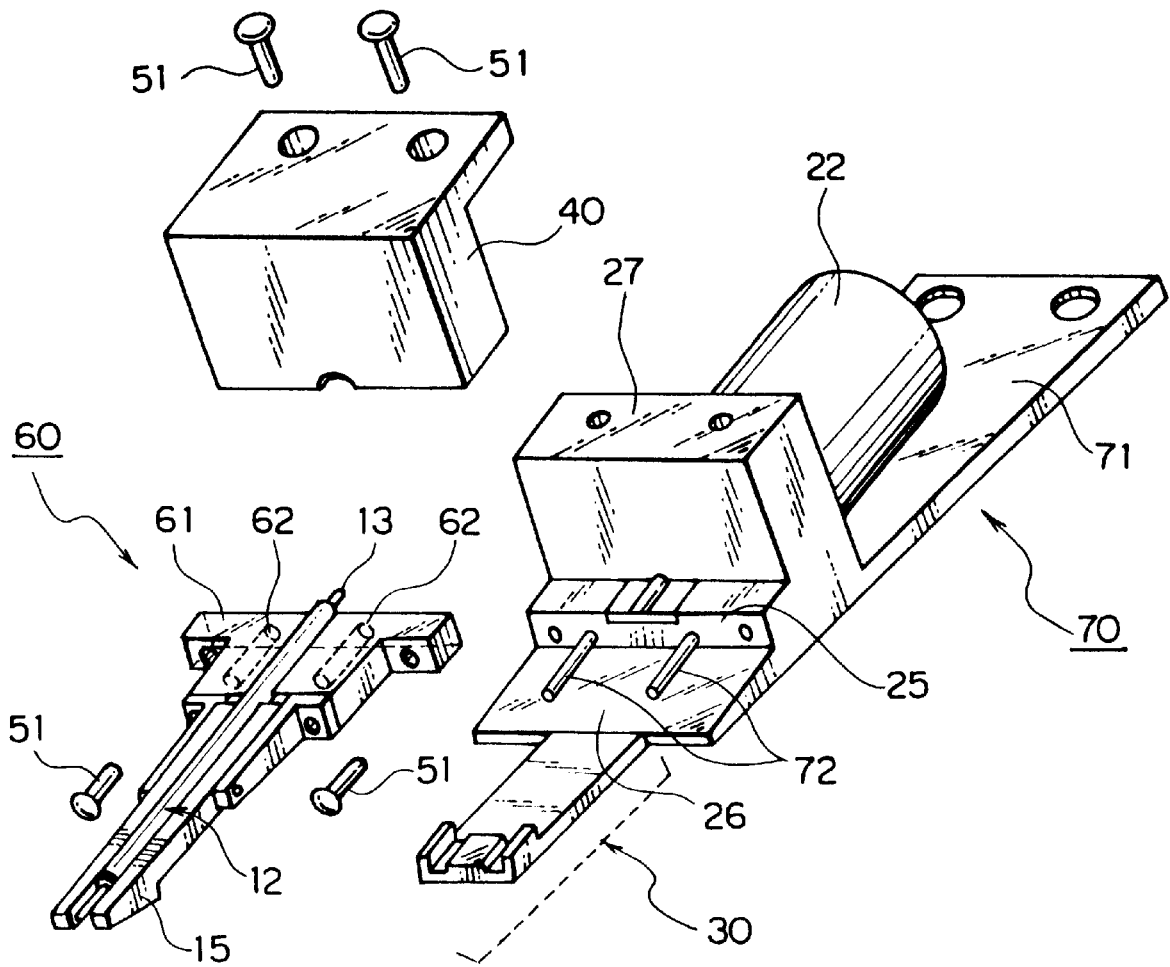
FIG. 8 is an exploded perspective view showing a partial appearance at the time of dissembling another embodiment different from the one in FIG. 6.

FIG. 8 is an exploded perspective view showing a partial appearance at the time of disassembling an embodiment different from the embodiment of FIG. 6. A body block 71 of a probe body 70 has the same end unit support surface 25, the end unit arrangement surface 26 and the central block 27 shown in FIG. 6.

One aspect of the embodiment in FIG. 8 different from that in FIG. 6 is that the end unit block 61 has two positioning pin holes 62 on the end face contacting the end unit support surface 25 of the body block 71. The positioning pin holes 62 are parallel to the linear coaxial cable 12. Correspondingly, the end unit support surface 25 of the central block 27 in the body block 71 has two positioning pins 72 or protrusions and can fix the end unit 60 upon being inserted into the two positioning pin holes 62. The two positioning pins 72 are parallel to the end unit arrangement surface 26.

Due to this construction, it becomes possible to determine two directions for positioning the end unit 60 in the body block 71 of the probe body 70.

In addition, since at least one direction can be determined even if there is only one positioning pin, positioning on the end unit support surface 25 and the end unit arrangement surface 26 can be performed more easily.

Figure 9:
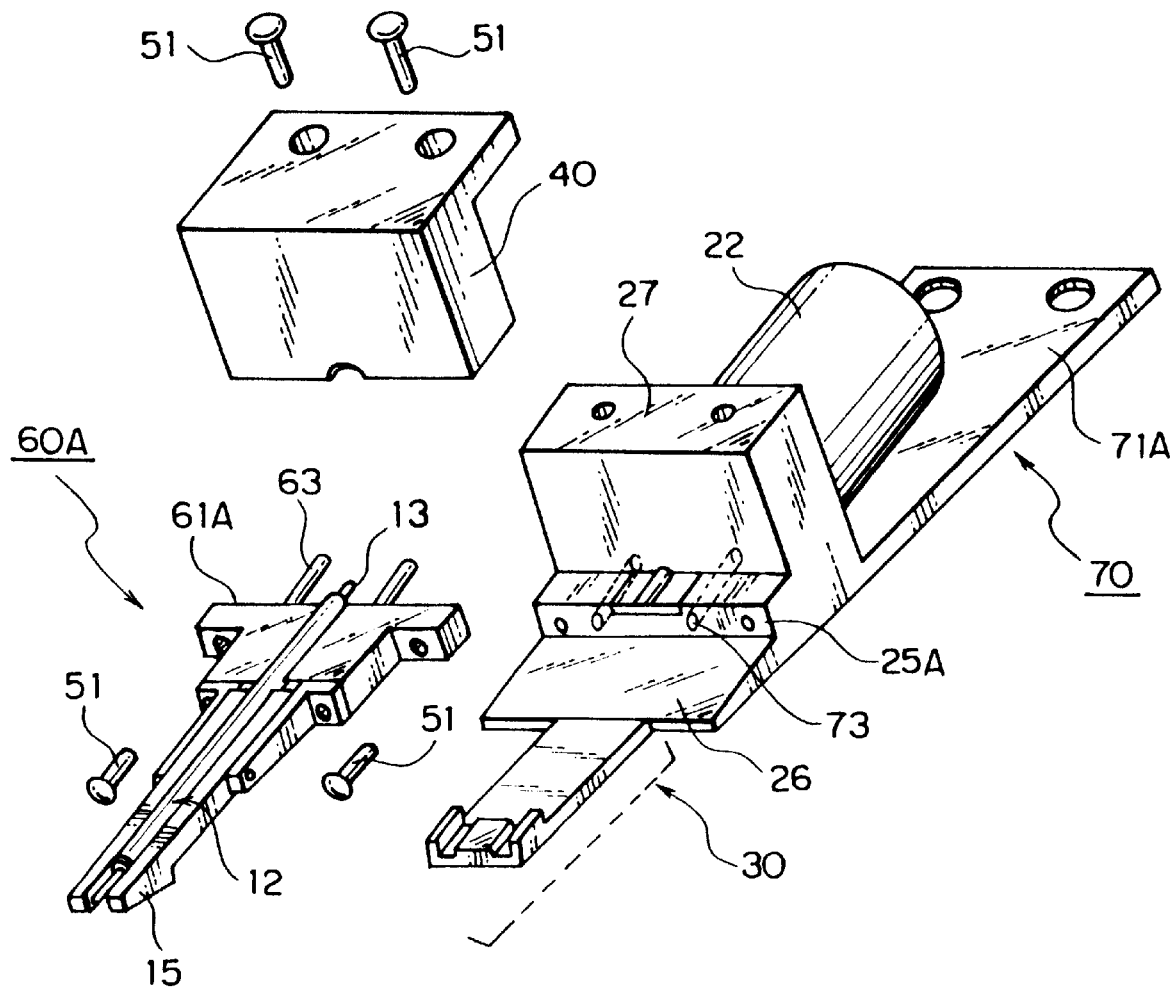
FIG. 9 is an exploded perspective view showing a partial appearance at the time of disassembling an embodiment different from the one in FIG. 8.

Referring to FIG. 9, a description will be provided for another embodiment different from the one shown in FIG. 8.

One differing aspect of this embodiment is that an end unit block 61A of an end unit 60A has two positioning pins 63 instead of the two pin holes 62 in FIG. 8. Another point of distinction is that an end unit support surface 25A of a body block 71A has two positioning pins holes 73 instead of the two pins 72 in FIG. 8.

Although it is illustratively described above that the end unit support surface 25A and the contact surface of end unit block 61A are flat, these surfaces are not necessarily planar surfaces but may have any shape which is vertical to the end unit arrangement surface 26 and are matingly fitted with each other. For example, the above shape may be a wave form, a saw-toothed wave form, and the like.

Referring now to FIGS. 10A, 10B, 11A, and 11B, a first embodiment of the end unit 10 shown in FIG. 6 will be described below.

As shown in the drawings, the end unit 10 is composed of an end unit block 11, a coaxial cable 12, two ground plates 15, a central guide 140, and a base guide 150.

The central guide 140 and base guide 150 are fixed with screws 151 in the end unit block 11. When fixed, the central guide 140 and base guide 150 hold two ground plates 15 to define a transmission line by pinching the coaxial cable 12 in between their surfaces.

Figure 10A:
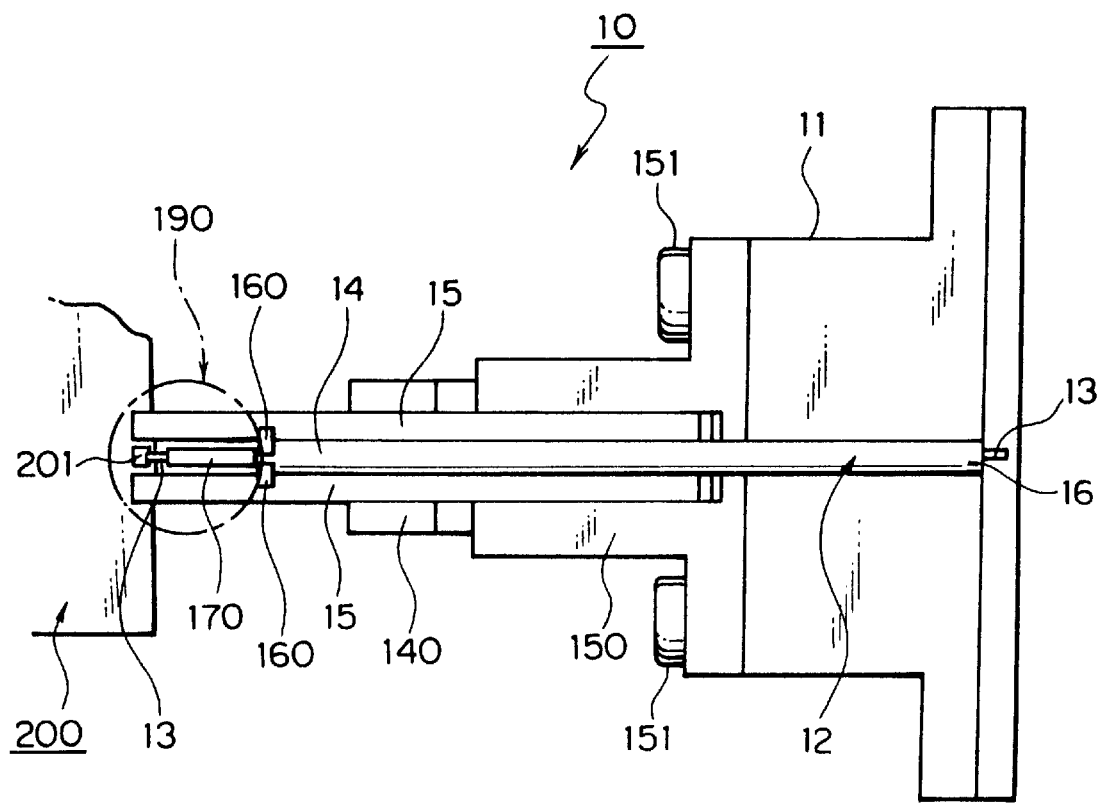
FIG. 10A is a plan view showing an embodiment of an end unit according to the present invention.

The coaxial cable 12 is formed by a coaxial outer conductor 14, which becomes a ground line, with a coaxial inner conductor 13, which becomes a signal line, as the central axis. A dielectric 16 is provided between the outer conductor 14 and the inner conductor 13. The coaxial inner conductor 13 is made of a metal having elasticity and wear resistance such as tungsten, beryllium copper, or phosphor bronze. In addition, the coaxial inner conductor 13 has an end part that is exposed and contacts the electrodes of the device-under-test 200. The electrode-contacting end part is sharply ground, and hence can contact a fine signal electrode 201 of the device-under-test 200 as shown in FIG. 10A. The coaxial outer conductor 14 is sandwiched by the two ground plates 15.

Figure 10B:
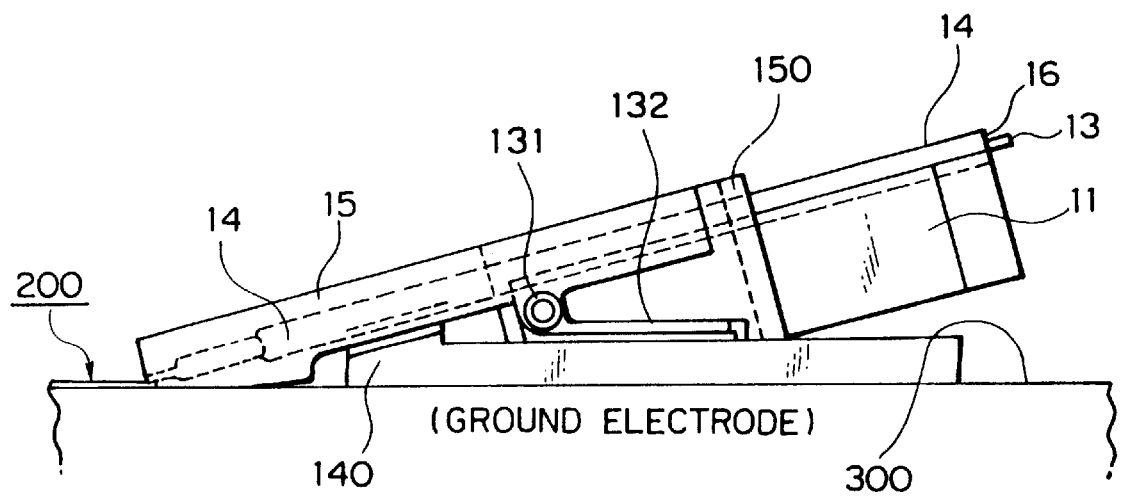
FIG. 10B is a side view of the end unit of FIG. 10A.

The two ground plates 15 made of metal defines a stripline construction for the transmission line by being arranged in parallel on both sides of an end part of the coaxial inner conductor 13 which is exposed to contact an electrode of the device-under-test 200. Furthermore, the ground plates 15 hold the coaxial cable 12 from both sides. Moreover, each of ground plates 15 has a branch part 132 that is composed as a punch-shaped spring with a pin 131 as the pivot so as to provide contact pressure for contacting its end to the ground electrodes of the device-under-test 200 as shown in FIG. 10B.

Figure 11A:
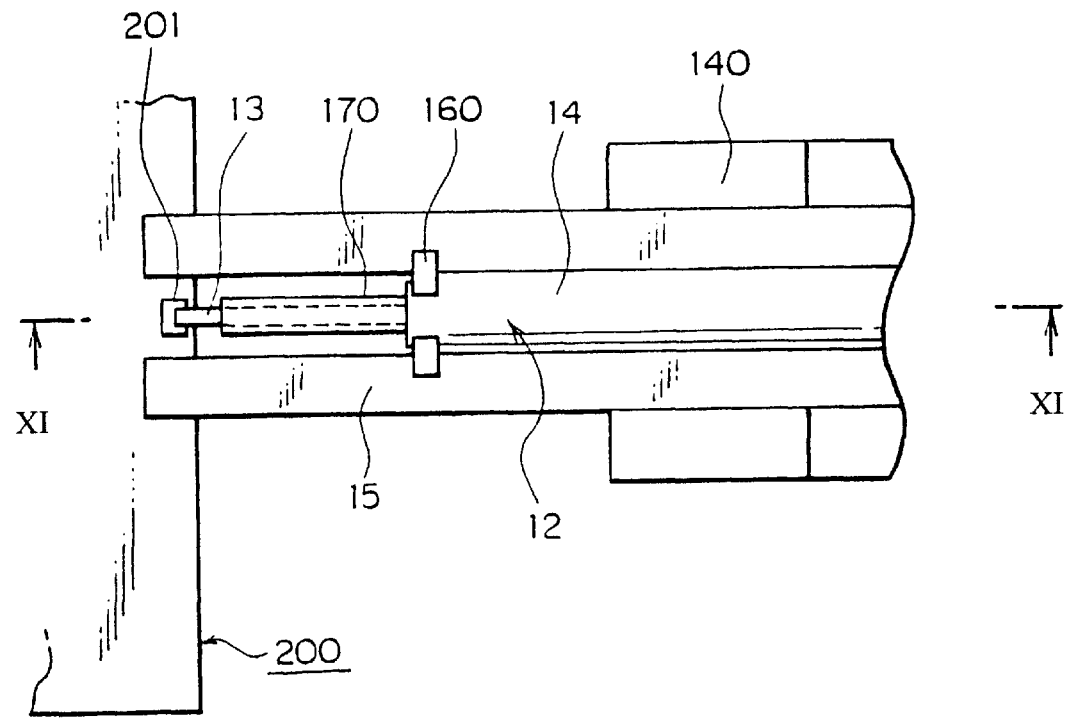
FIG. 11A is an enlarged plan view of a probe end part in FIG. 10A.
Figure 11B:
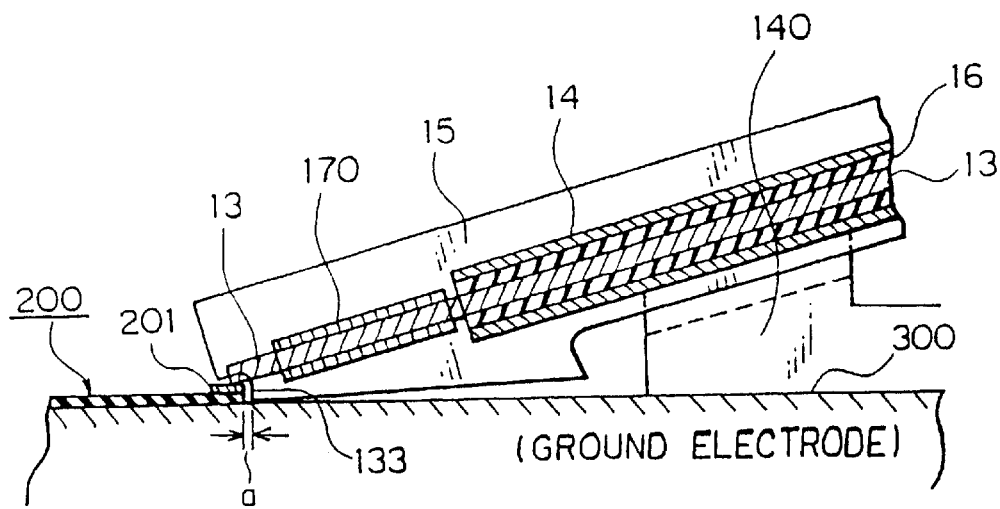
FIG. 11B is a cross-section taken along line XI13 XI in FIG. 11A.

In addition, each of the ground plates 15, as shown in FIG. 11B, further has a notch 133 at the lower end of the end part on the device contact side. This notch 133 is provided to enable the coaxial inner conductor 13 to contact a device stage 300 at a point so as to minimize the distance "a" from the device-under-test 200 when the coaxial inner conductor 13 contacts a signal electrode 201 of the device-under-test 200.

The central guide 140 holds central parts of the ground plates 15, is arranged between a surface contacting the device stage 300 and the branch part 132 of the ground plates 15, and further can electrically connect the surface of the device stage 300 to the ground plates 15. Therefore, if the ground electrode of the device-under-test 200 is on its backside, the surface of the device stage 300 is ground potential, and hence the ground potential is applied to the ground plates 15 through the central guide 140.

In addition, the base guide 150 holds a base part of the ground plates 15 where the ground plates 15 closely contacts the end unit block 11. Furthermore, as shown in the drawing, gold ribbons 160 secure electrical connection between the ground plates 15 and coaxial outer conductor 14. Moreover, a metal pipe 170 is fit over the exposed part of the end part of the coaxial inner conductor 13 to match the characteristic impedance of the high-frequency probe.

The above-described notch 133 in the device contact side of each ground plate 15 shown in FIG. 11B provides a reliable contact with the ground plate of the device stage 300 before the probe contacts the device.

Figure 12A:
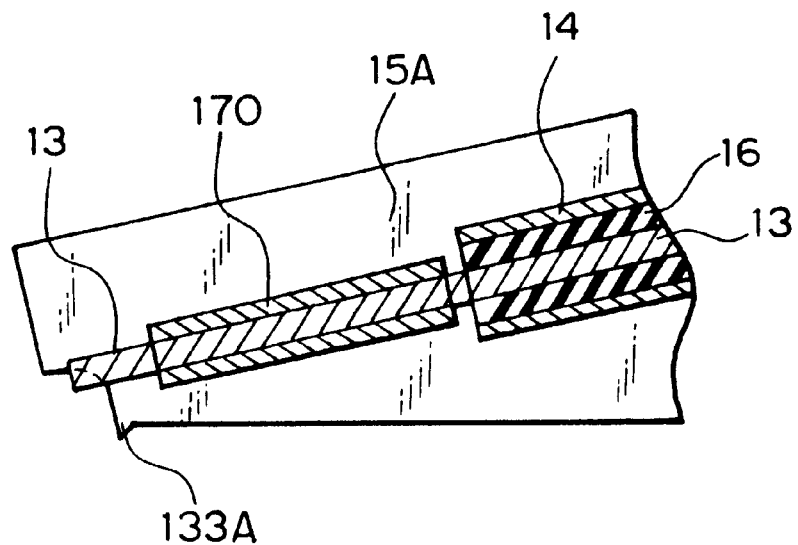
FIG. 12A is an enlarged cross-section showing an embodiment of a notch portion contacting the device stage shown in FIG. 11B.
Figure 12B:
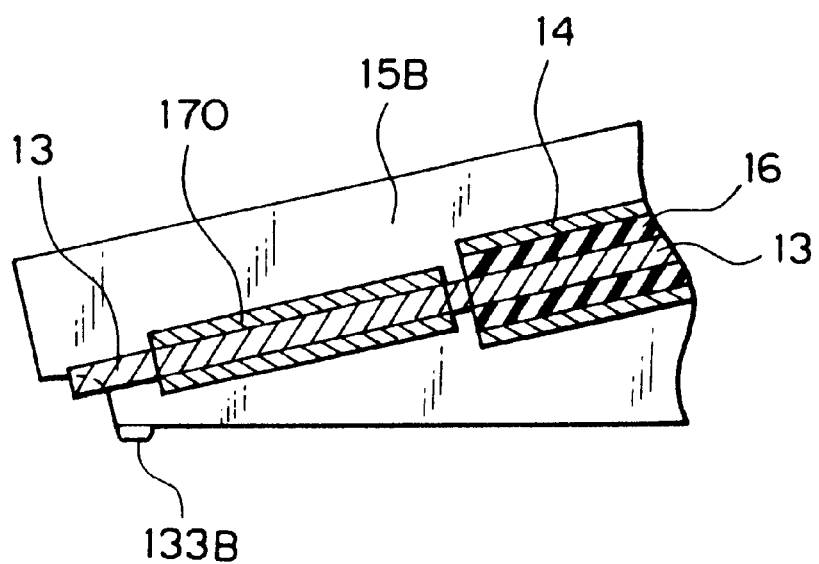
FIG. 12B is an enlarged cross-section showing another embodiment of a notch portion different from the one in FIG. 12A.

FIG. 12A and 12B are alternative views of an enlarged cross-section showing the notch for providing the reliable contact.

As shown in FIG. 12A, a notch 133A on ground plate 15A forms a sharp shape such as that of a knife. Alternatively, as shown in FIG. 12B, a notch 133B on ground plate 15B forms a small bump.

Figure 13:
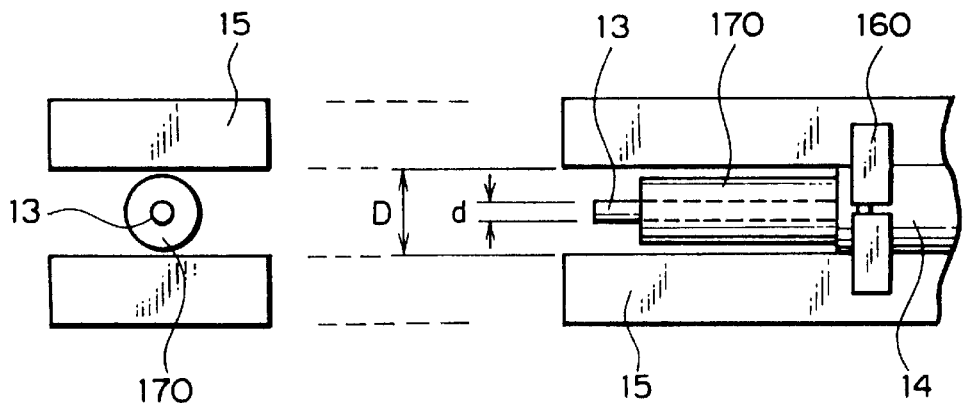
FIG. 13 is a front view and a plan view that show the probe end part in FIG. 10A.
Figure 14:
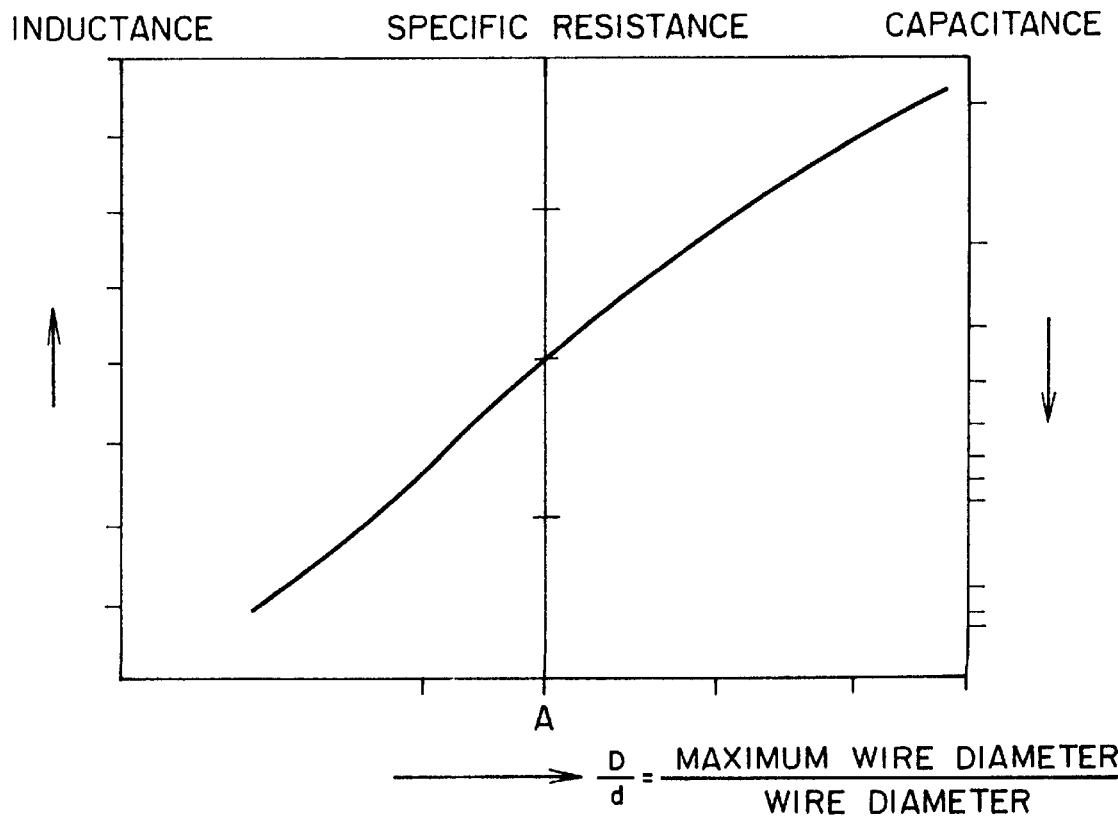
FIG. 14 is a chart for calculating characteristic impedance of a high-frequency probe according to the present invention.

Referring now to FIGS. 13 and 14, the characteristic impedance of the high-frequency probe 10 will be described.

As seen in FIG. 13, the metal pipe 170 is fit over the exposed end part of the coaxial inner conductor 13 in the probe end part 190 shown in FIG. 10A. The metal pipe 170 makes it possible to perform impedance matching of the probe end part 190 or to change the characteristic impedance of the probe end part 190.

FIG. 14 is a sample of a calculation chart showing the capacitance and inductance of the characteristic impedance of the high-frequency probe against the inherent resistance with "D/d" as the horizontal axis. Here, "d" is the wire diameter of the coaxial inner conductor 13 and "D" is a gap between the two ground plates 15, which becomes the maximum allowable wire diameter, as shown in FIG. 13.

As shown in the drawing, it is apparent that if the gap "D" of the ground plates 15 is constant and the wire diameter "d" of the coaxial inner conductor 13 is enlarged, the wire diameter ratio becomes small. Therefore, the ratio moves to the left side from the "A" point, which is the center of the chart, and it is apparent that a capacitive component is added to the characteristic impedance. On the other hand, if the wire diameter "d" of the coaxial inner conductor 13 is decreased, an inductive component is added.

Therefore, by a slenderly producing beforehand the wire diameter "d" of the coaxial inner conductor 13 that has the inductive component, producing the metal pipe 170 having the capacitive component so that the impedance of the probe end part 190 can match, and fitting the pipe 170 over the coaxial inner conductor 13, impedance matching is accurately achieved. This makes the characteristic impedance of the probe end part 190 variable by producing and keeping a plurality of metal pipes having different capacitive components, and selecting and fitting an appropriate one of the metal pipes.

Figure 15A:
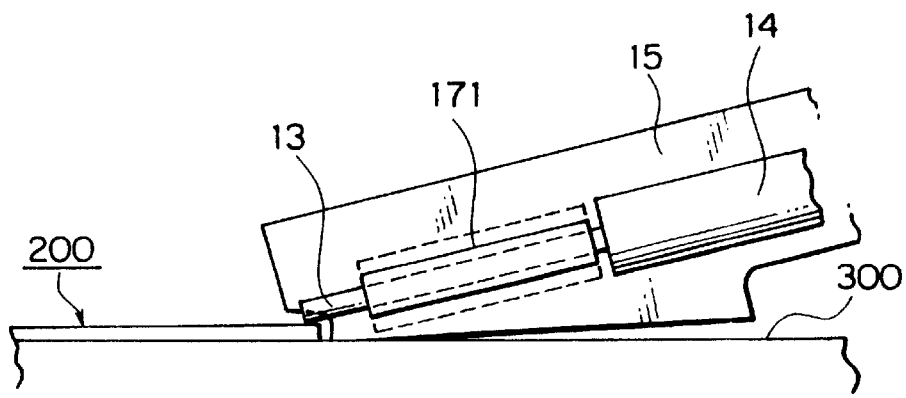
FIG. 15A is an explanatory side view showing an embodiment in which the diameter of the pipe in FIG. 11A is changed.

Thus, in FIG. 15A, the outer diameter of a metal pipe 171 can be changed from the metal pipe 170 in FIG. 13. In this manner, increasing the outer diameter of the metal pipe 171 effectively increases the wire diameter of the coaxial inner conductor 13. Therefore, as can be seen from the chart of FIG. 14, the capacitive component can be increased by increasing the outer diameter of the metal pipe 171.

Figure 15B:
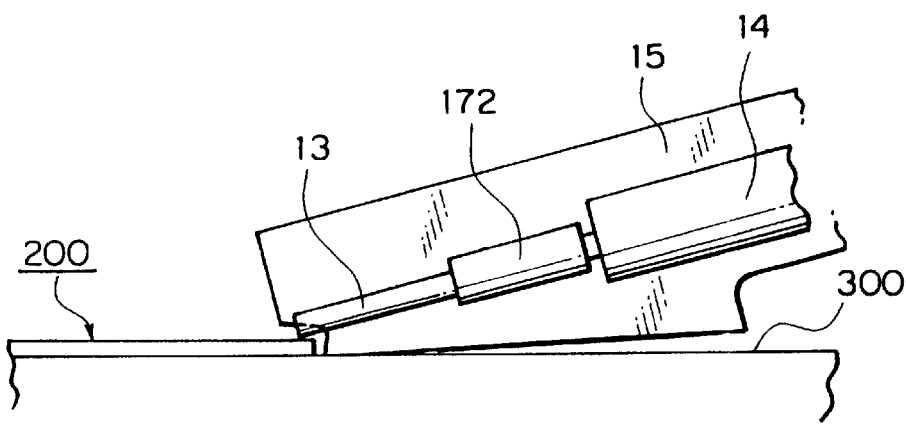
FIG. 15B is an explanatory side view showing an embodiment in which the length of the pipe in FIG. 11A is shortened.

In FIG. 15B, a metal pipe 172 having half the length of the metal pipe 170 shown in FIG. 13 is fitted over the base part of the coaxial inner conductor 13 that is exposed. In addition, in FIG. 15C, a metal pipe 173 having an even shorter length is fitted on the exposed coaxial inner conductor end. Since the surface areas facing the ground plates 15 change due to length changes like these, it is possible to change the quantity of the capacitive component to be added.

Figure 15C:
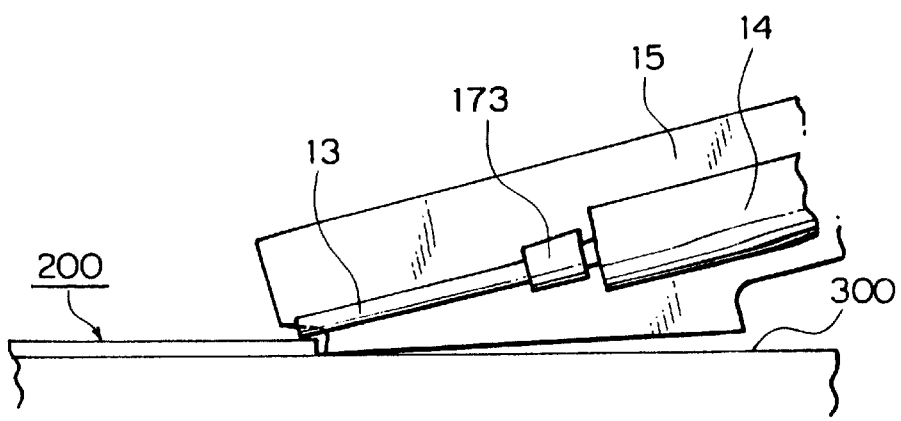
FIG. 15C is an explanatory side view showing an embodiment in which the length of the pipe in FIG. 15B is further shortened.
Figure 15D:
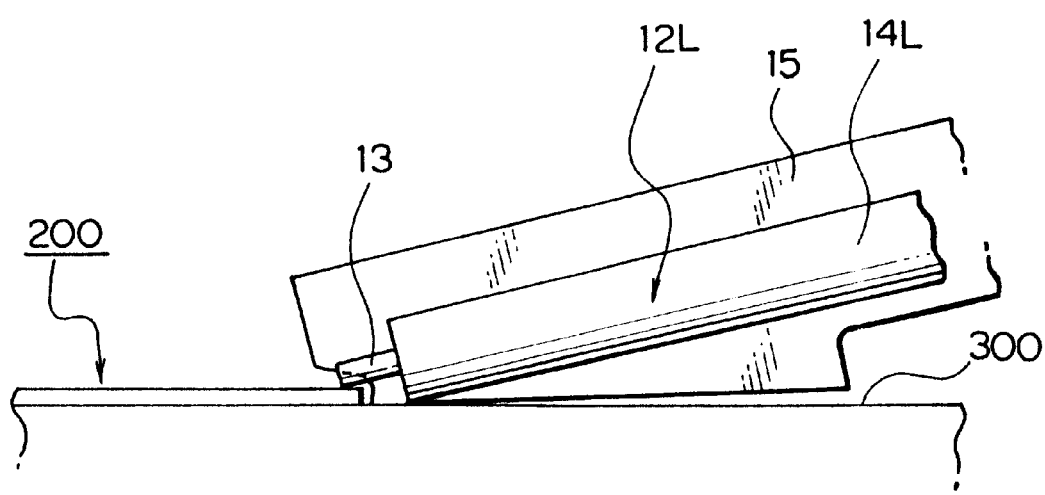
FIG. 15D is an explanatory side view showing an embodiment without a pipe.

Furthermore, in FIG. 15D, a coaxial cable 12L is substituted for the coaxial cable 12 in FIGS. 15A through 15C, wherein coaxial outer conductor 14L extends close to the device-under-test 200 and thereby fixes the characteristic impedance.

Figure 16A:
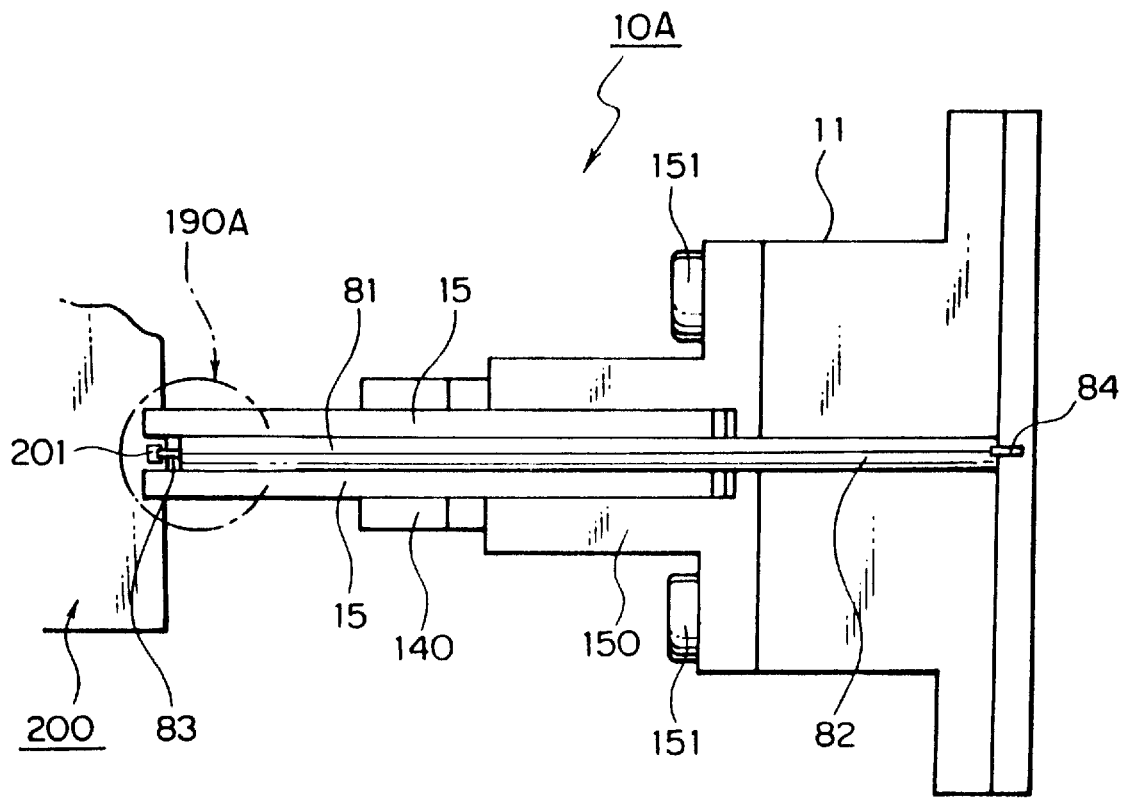
FIG. 16A is an enlarged plan view of another embodiment of an end unit different from the embodiment shown in FIG. 10A.
Figure 16B:
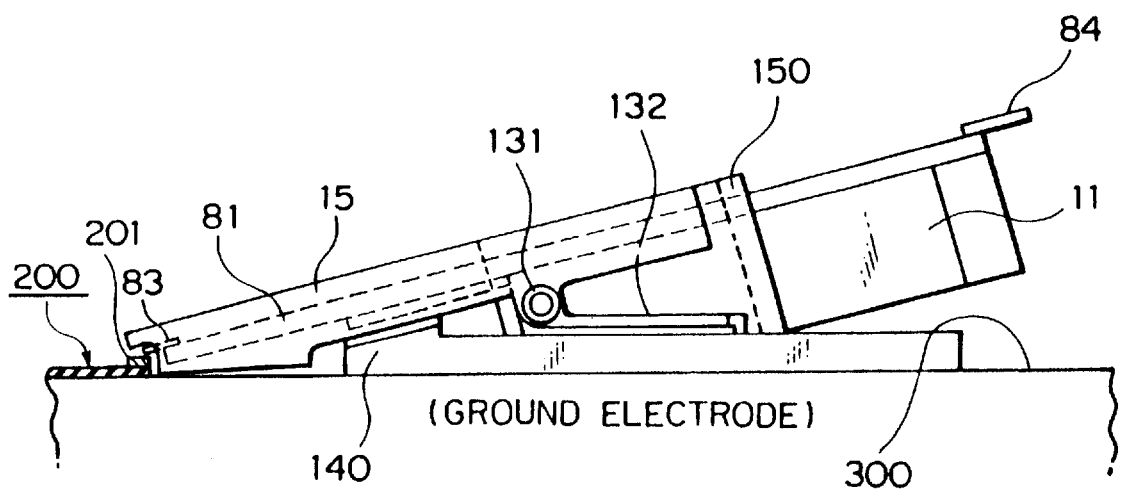
FIG. 16B is a side view of the end unit of 16A.

FIGS. 16A and 16B show another embodiment of an end unit 190A different from the embodiment shown in FIG. 10A.

One of the differing points is that a circuit board 81 is provided instead of the coaxial cable 12 in FIG. 10A. Accordingly, the circuit board 81 has a signal conductor 82 arranged along the mid line of the surfaces to form a stripline between the side ground plates 15. The signal conductor 82 has a needle 83 to contact a signal electrode of a device-under-test 200 at one end and a signal pin 84 to connect with the central signal conductor 24 at the other end as shown in FIG. 6.

Figure 17A:
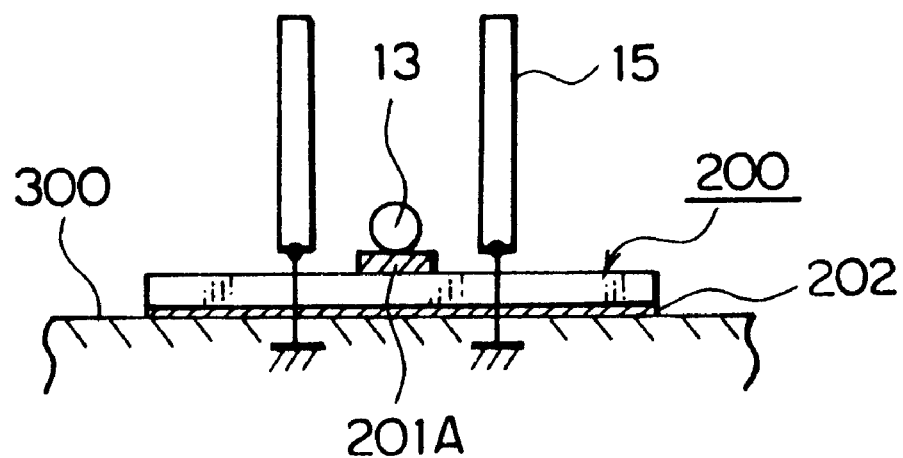
FIG. 17A is an explanatory front view showing the high-frequency probe of the present invention during a measuring operation.
Figure 17B:
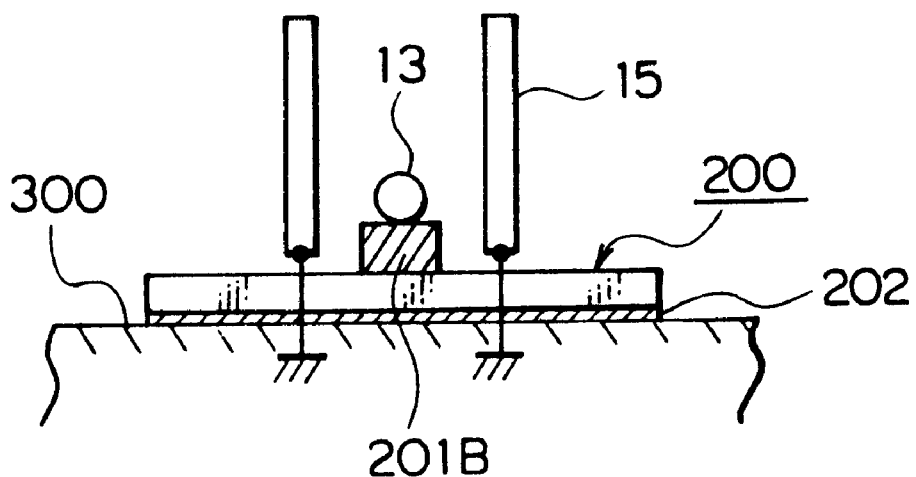
FIG. 17B is an explanatory front view showing the probe performing a measuring operation when the signal electrode is at a greater height level than that in FIG. 17A.

Referring now to FIGS. 17A, 17B and 10A, the probe end part 190 shown in FIG. 10A or the probe end part 190A in FIG. 16A contacting a device-under-test 200 will be described. In FIG. 17A, the device-under-test 200 has a signal electrode 201A having low height. In FIG. 17B, a device-under-test 200 has a signal electrode 201B having a high height.

When measurement is performed with the high-frequency probe, the coaxial inner conductor 13 is contacted to the signal electrode 201 (201A or 201B) of the device-under-test 200, and the ground plates 15 on both sides are pressed against the surface of the device stage 300. At this time, the transmission line of the coaxial cable 12 composed of the coaxial inner conductor 13 and coaxial outer conductor 14 bends only in the pressed direction within the space formed by ground plates 15.

On the other hand, the surface of the device stage 300 forms a ground surface by closely contacting the backside of the ground electrode of the device-under-test 200. Therefore, the wide ground plates 15 sandwich the bendable coaxial inner conductor 13 with the device stage 300 as the reference ground. Hence, in the high-frequency probe, even if the height of the signal electrode 201 varies from one to the next such as with electrodes 201A and 201B, a distributed constant circuit where the impedance in the probe end part 190 is matched is formed. In consequence, in the high-frequency probe, an excellent high-frequency characteristic can be obtained.

As described above, the high-frequency probe according to the present invention can change the impedance characteristic of the probe end part 190 by changing the gap between the coaxial inner conductor 13 and ground plates 15 by fitting a metal pipe over the end of the coaxial inner conductor 13. In addition, ground connection to the device-under-test 200 can be secured due to the elastic construction of the branch part of the ground plates 15, and conduction can be obtained by the ground electrode 202 on the backside of the device-under-test 200 and the device stage 300 closely contacting as shown in FIGS. 17A and 17B.

Therefore, it becomes possible to minimize the distance between the ground plates 15 and device-under-test 200. Hence, the high-frequency probe according to the present invention makes it possible to perform reproducible measurements even if the ground electrode 202 is not on the same plane as the signal electrode 201A or 201B in the device-under-test 200 and is grounded entirely on the backside of the device-under-test 200.

Furthermore, since the coaxial cable 12 is sandwiched and held by the ground plates 15 in its base part as shown in FIG. 10A, the coaxial inner conductor 13 never swings in the direction perpendicular to the direction in which the coaxial inner conductor 13 moves to contact the device-under-test 200. Therefore, it is possible to obtain compliance in the pressed direction while keeping the appropriate positional relation between the coaxial inner conductor 13 and the coaxial outer conductor 14.

In addition, since gold ribbons 160 connect the coaxial outer conductor 14 to the ground plates 15, it is possible to obtain an excellent ground characteristic. Furthermore, since, in the vicinity of the end part of the coaxial inner conductor 13, the stripline construction is formed by the ground plates 15 on both sides, the characteristic impedance at the time of contacting the device-under-test 200 does not fluctuate. Therefore, measurement results having excellent high-frequency characteristics can be obtained.

Figure 18A:
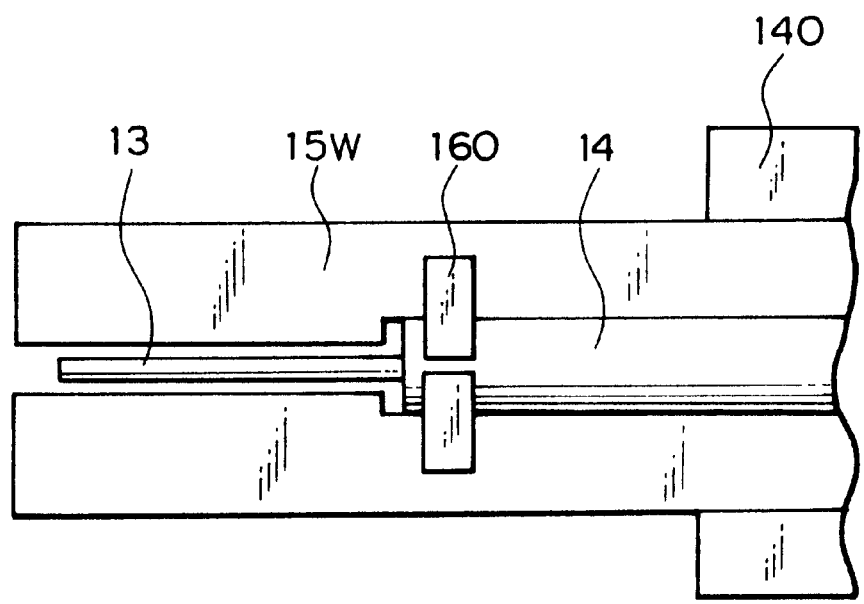
FIG. 18A is an explanatory plan view showing modification of the shapes of the ground plates except for the pipe shown in FIG. 11A.
Figure 18B:
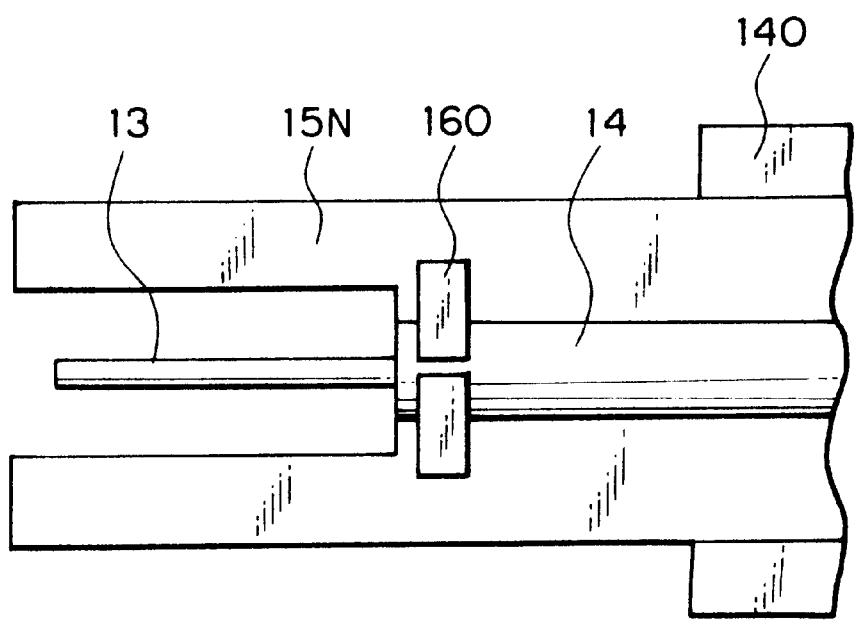
FIG. 18B is an explanatory plan view showing modification of the shapes of the ground plates shown in FIG. 11A or 18A.

Referring to FIGS. 18A and 18B, ground plates 15W and 15N which are different from the ground plate 15 in the probe end part 190 shown in FIG. 10A will be described below.

In FIG. 18A, the ground plates 15W are formed such that the distance between the outer surfaces of the two ground plates 15W are fixed while the gap between the two ground plates 15W is made narrow by thickening the plates to sandwich the exposed end of the coaxial inner conductor 13. On the other hand, in FIG. 18B, the ground plates 15N are formed such that the distance between the outer surfaces of the ground plates 15N are fixed while the gap between the two ground plates 15N is made wide by thinning the portions sandwiching the exposed end portion of the coaxial inner conductor 13.

In this manner, by changing the gap between the two ground plates 15 in FIG. 13, it is possible to change the capacitive component and inductive component by means of the calculation method described with reference to FIG. 14. Thus, the ground plates 15 are constructed to enable the optional selecting and changing of the different parts.

Furthermore, referring to FIG. 19, a detachable ground plate 15S will be described below. The ground plate 15S and a ground plate tip 15Sa form the ground plate 15 as seen in FIG. 13. The ground plates 15S are sandwiched and held by the central guide 140 and the ground plate tip 15Sa can be detached from each of the ground plates 15S.

Figure 19:
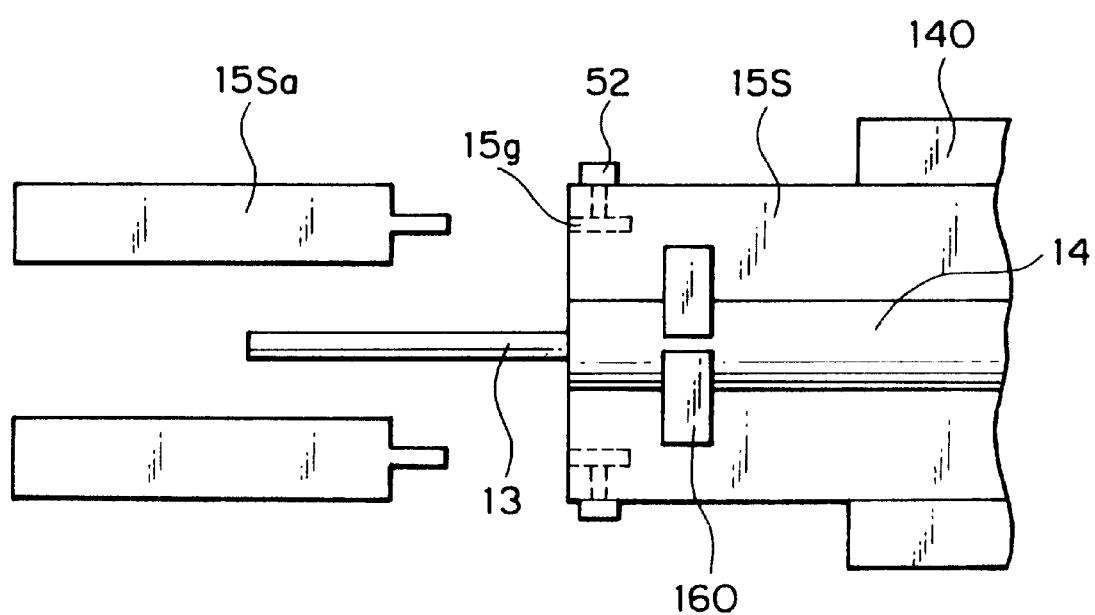
FIG. 19 is an explanatory plan view showing separable end parts of the ground plates shown in FIG. 11A.

In an example shown in FIG. 19, the ground plate 15S has a groove 15g for fitting with the ground plate tip 15Sa, which is assembled and fixed with a screw 52 for the sake of enabling electrical conduction between the ground plate 15S and the ground plate tip 15Sa. Further, the ground plate tip 15Sa covers the exposed portion of the coaxial inner conductor 13 in FIG. 19. As a result, by changing the ground plate tips 15Sa, the gap between ground plates 15 in FIG. 13 can be easily changed to vary the gap difference as needed as shown in FIGS. 18A or 18B. Of course, the groove 15g may be provided in the ground plate tips 15Sa instead of in the ground plate 15S.

Figure 20:
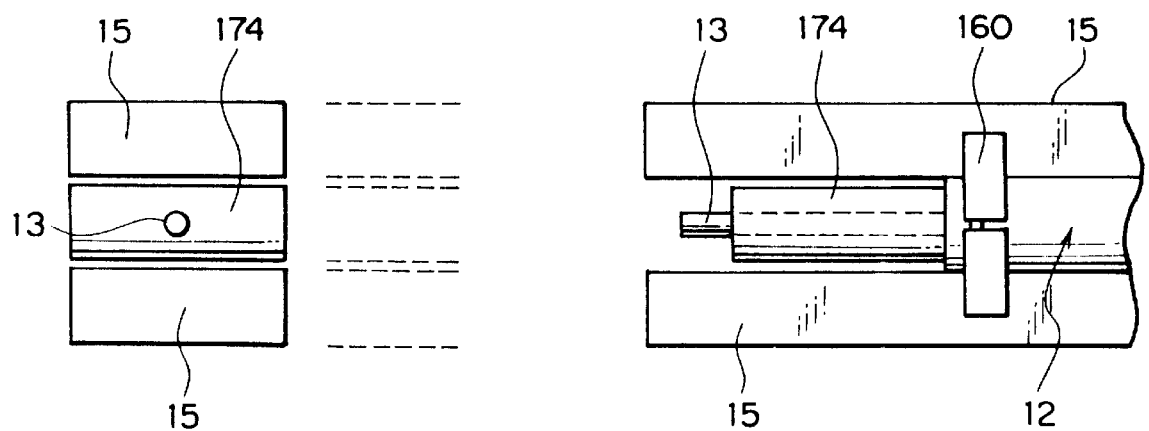
FIG. 20 is an explanatory front view and a plan view that show a modification of a shape of the pipe in FIG. 11A.

Referring now to FIG. 20, a metal block 174 used instead of the metal pipe 170 through 173 described above, will be described.

The metal block 174, as shown in the drawing, is constructed so that the exposed coaxial inner conductor 13 is fitted in a central hole, and functions as an impedance adjustment member. The metal block 174 is formed as a rectangular solid having surfaces that are parallel to the inner surfaces of both ground plates 15. Owing to this shape, the metal block 174 can have wide areas which face the ground plates 15 and have a capacitive component between itself and the ground plates 15. Hence, it is possible to add a largely capacitive component to the characteristic impedance of the probe end part 190 shown in FIG. 10A.

Although the impedance adjustment described above is described with using metallic material as the metal pipe 170 through 173 or metal block 174, dielectric material also can add a largely capacitive component since the dielectric material has a dielectric constant or a relative dielectric constant higher than air. In addition, it is possible to change a capacitive value by using dielectric materials having different relative dielectric constants.

Furthermore, although it is shown and described that the coaxial inner conductor 13 is fitted and fixed in a central hole along the central axis, a groove instead of the hole can be used if the coaxial inner conductor 13 is sufficiently fixed.

Figure 21A:
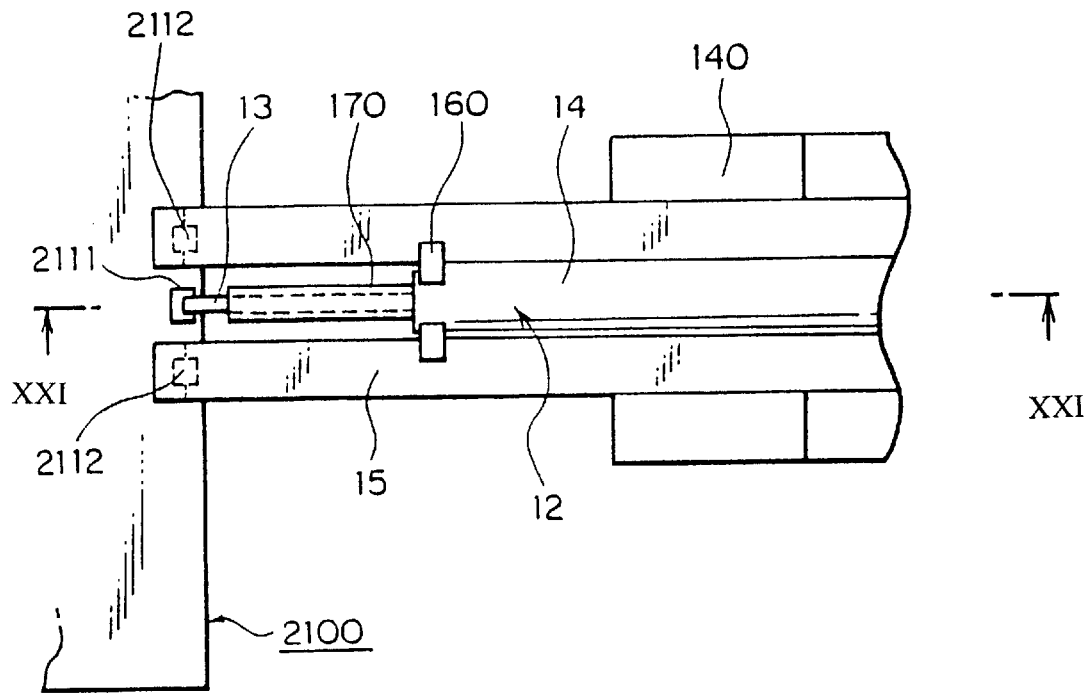
FIG. 21A is an enlarged plan view of a probe end part against a coplanar-type device-under-test which is different from the one shown in FIG. 11A.
Figure 21B:
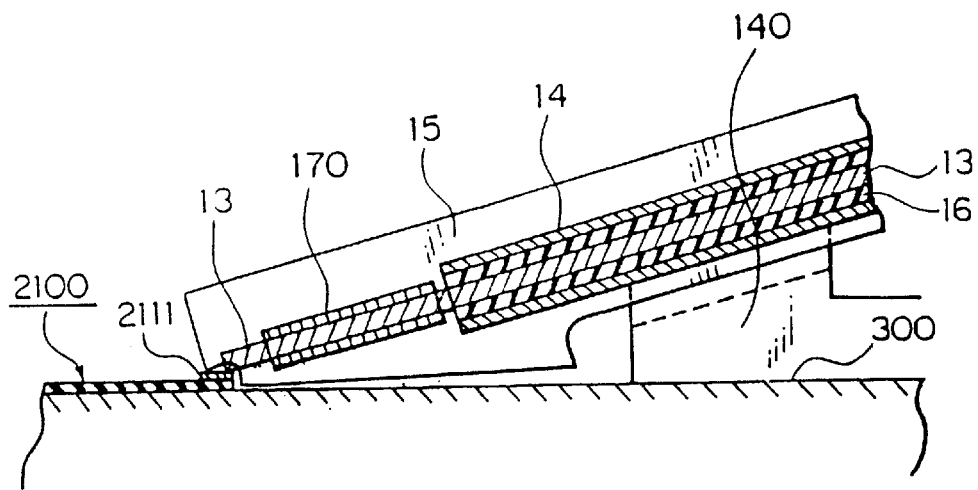
FIG. 21B is a cross-section taken along line XXI—XXI in FIG. 21A.

Referring now to FIGS. 21A and 21B, a description will be provided for another example of contacting the probe to a device in a manner which is different from that shown in FIGS. 11A and 11B. Here, the probe is used to contact a coplanar type device-under-test 2100. The ground plates 15 directly contact the ground electrodes 2112 at the time the coaxial inner conductor 13 contacts the signal electrode 2111 on the device-under-test 2100 with coplanar arrangement electrodes. Thus, it is possible to measure the high frequency characteristics of the device-under-test 2100 of coplanar construction.

Figure 22:
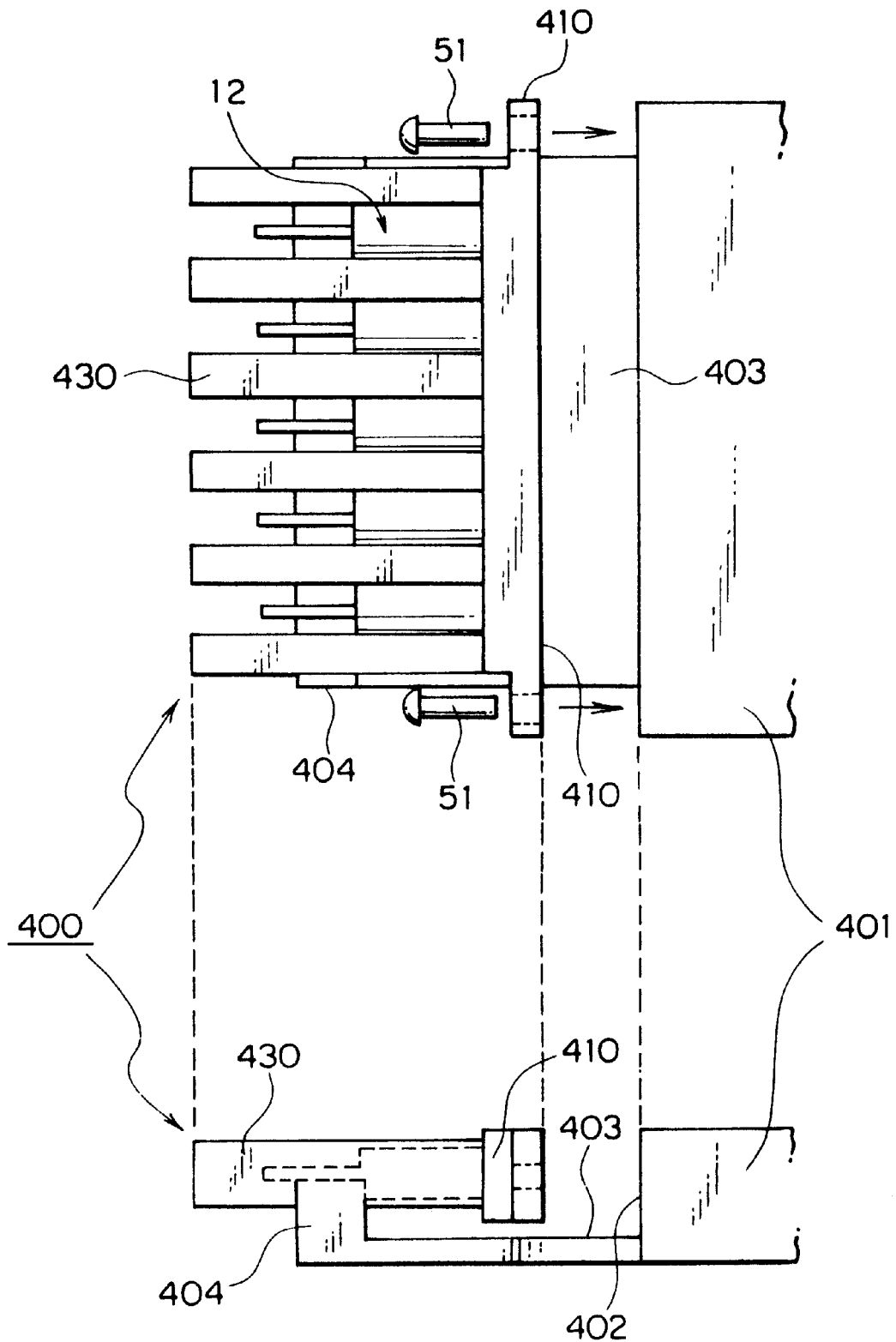
FIG. 22 is a plan view and a side view that show an assembly having a plurality of end conductors in an end unit according to the present invention.

Referring now to FIG. 22, an embodiment of an end unit 400 having a plurality of coaxial cables 12 and ground plates 430 will be described.

The end unit 400 shown in FIG. 22 has such construction that a plurality of coaxial cables 12 and ground plates 430 are alternately arranged in one end unit block 410 and both ends are sandwiched by the ground plates 430. A body block 401 comprises an end unit support surface 402 and an end unit arrangement surface 403 that are similar to those in FIG. 6, and an end part guide 404 that is an extension of the end unit arrangement surface 403, and has a shape for accommodating the end unit 400.

Figure 23:
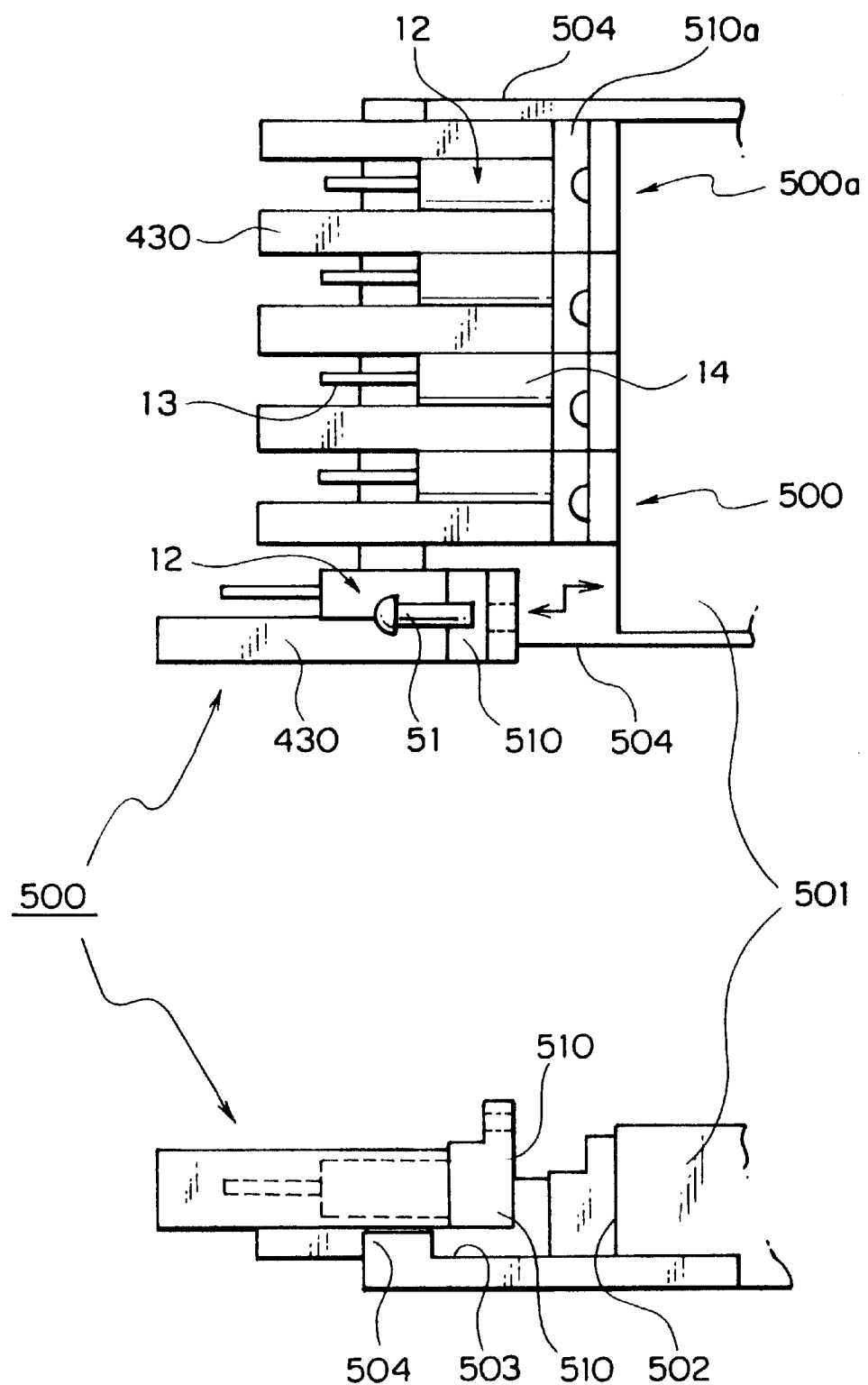
FIG. 23 is a plan view and a side view that show an assembly having a plurality of end conductors different from the ones in FIG. 22.

Referring to FIG. 23, another embodiment different from the one in FIG. 22 will be described below. The difference resides in the plurality of end units 500, which are assembled in one body and have a plurality of coaxial cables 12 and a ground plate 430.

The end unit 500 shown in FIG. 23 is constructed such that, a coaxial cable 12, a ground plate 430 and an end unit block 510 are assembled in one body, and a plurality of end units 500 are arranged on the same plane. In order to obtain such construction that both sides are sandwiched by the ground plates 430, a ground plate 430 is additionally provided at an end unit 500a only. Accordingly, the end unit 500a comprises a coaxial cable 12, two ground plates 430 and an end unit block 510a whereon the ground plates 430 are arranged so as to sandwich a coaxial cable 12 from both sides.

On the other hand, a body block 501 comprises an end unit support surface 502 and an end unit arrangement surface 503 that are similar to those in FIG. 6. And the body block 501 further comprises an end part guide 504 that is an extension of the end unit arrangement surface 503, and has a shape for accommodating the arrangement guide of a plurality of the end units 500 described above.

Figure 24A:
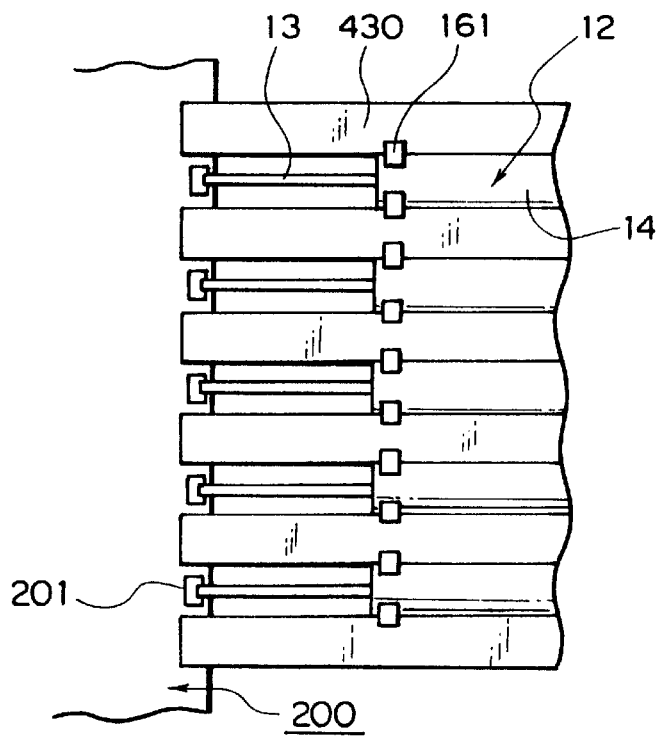
FIG. 24A is a plan view showing a case in which a high-frequency probe simultaneously contacts a plurality of signal electrodes with an end unit of the present invention.
Figure 24B:
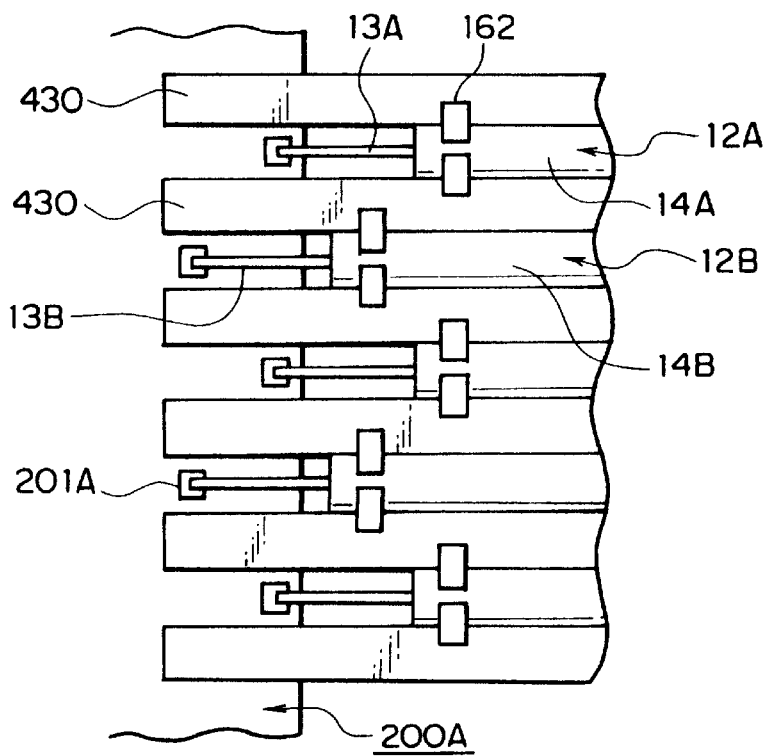
FIG. 24B is a plan view showing a different arrangement of the signal electrode from that shown in FIG. 24A.

Referring to FIGS. 24A and 24B, a description will be provided for the contact arrangement for a plurality of coaxial cables 12.

As shown in FIG. 24A, this embodiment alternately provides a plurality of coaxial cables 12 and ground plates 430 in a probe end part.

This is constructed such that in the probe end part where the gold ribbons 161 are added to the ones in FIG. 22, five sets of a coaxial cable 12 and a ground plate 430 are alternately arranged in parallel and these sets are sandwiched on the same plane by a central guide suitable to this construction.

The high-frequency probe having the shape described above can effectively deal with a case in which a plurality of signal electrodes 201 of a device-under-test 200 are arranged in a line like an LSI device.

FIG. 243 shows another embodiment different from the one in FIG. 24A which is suitable for a device-under-test 200 in which the signal electrodes 201A are arranged in a zigzag shape.

Thus, two kinds of coaxial cables 12A and 12B are alternately arranged respectively at positions where the coaxial inner conductors 13A and 13B can contact the signal electrodes 201A.

Figure 25:
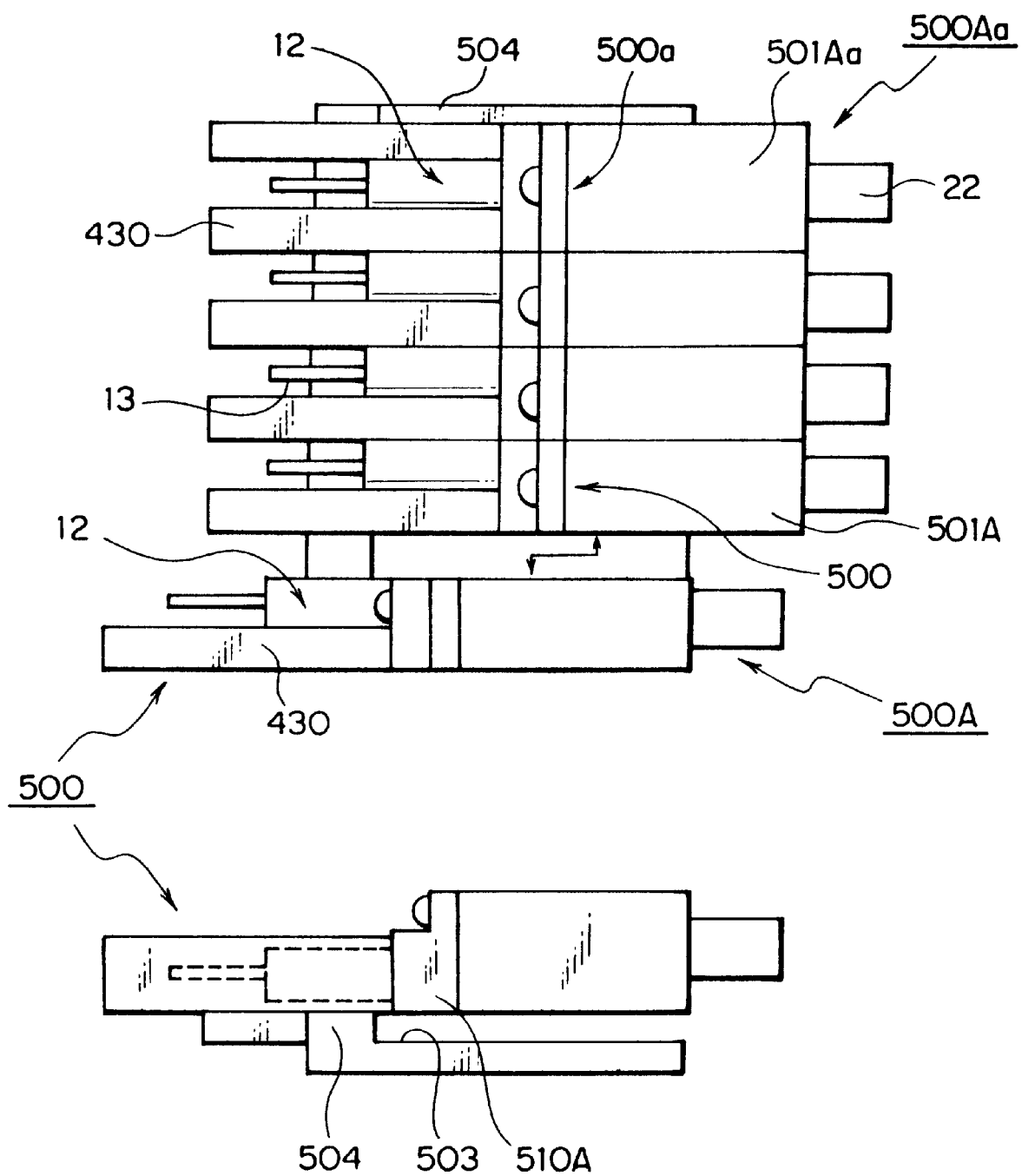
FIG. 25 is a plan view and a side view that show an assembly having a plurality of body blocks different from the ones in FIG. 23.

Referring to FIG. 25, another embodiment using the end units 500 and different from the one in FIG. 23 will be described. The point of differentiation from FIG. 23 is that body blocks 501A are divided corresponding to the end units 500 from the body block 500 in FIG. 23. And the end unit 500, the body block 501A and the coaxial connector 22 (shown in FIG. 6) are assembled in one body as an end unit element 500A.

As shown in FIG. 23, the end unit 500 is constructed such that a coaxial cable 12, a ground plate 430 and an end unit block 510 are assembled in one body. The end unit 500 is positioned on the end unit arrangement surface 503 and the end part guide 504. Accordingly, the end unit element 500A comprises the coaxial cable 12, the ground plate 430, the end unit block 510, the body block 501A and the coaxial connector 22.

As shown in FIG. 25, this probe further comprises only one end unit element 500A*a* on one side and has an end unit 500*a*, a body block 501A*a*, and the coaxial connector 22. A plurality of the end unit elements 500A and the end unit element 500A*a* can be arranged and assembled on the end unit arrangement surface 503 being guided by the end part guide 504.

Referring to the probe end part 190 shown in FIG. 10A and described above, this part is constructed such that a transmission line of the coaxial cable 12, which is composed of the coaxial inner conductor 13 and the coaxial outer conductor 14, and the ground plates 15 bend in the direction perpendicular to the electrode surfaces of the device-under-test 200. Therefore, the conductors can securely contact the respective electrodes. Hence, the arrangement of the coaxial cables 12 and the ground plates 15 becomes simple. In addition, since both side faces of the coaxial inner conductor 13 are sandwiched by the ground plate 15, it is possible to reduce any influence of crosstalk between coaxial cables 12. Therefore, this high-frequency probe can be used in a high-frequency region.

Now, the guide groove 32 as shown in FIG. 6 will be described. The guide groove 32 is provided as a mounting guide, wherein the number of guide grooves provided may be the same as that of ground plates 15 or only one.

In addition, in the above description, the direction in which the probe is pressed against the device-under-test is defined to be vertical, and the positional relation between the coaxial cable 12 and ground plates 15 is such that the ground plates 15 are provided on the left and right sides of the coaxial cable 12, that is, in the horizontal direction. Nevertheless, as described above, the ground plates 15 can be provided in the bending direction of the coaxial cable 12, that is, the vertical direction.

Although, in description relating to FIG. 6, it is shown and described that the ground plates 15 have a slender plate-like shape, the ground plates 15 can have another shape, and the shape of the end part guide 31 and guide groove 32 also can vary so long as the latter corresponds with the former. In addition, the end unit support surface 25 and end unit arrangement surface 26 which determine the position of the end unit 10 are each shown and described as one plane. Nevertheless, the end unit support surface 25 or end unit arrangement surface 26 can be formed as a plurality of surfaces or as a curved surface. In this manner, a positioning means of the end unit 10 according to the present invention is not limited to the above description.

Furthermore, the shape of the end which is pressed against the device-under-test by the end unit 10 is such that ground plates 15 are provided on both sides of the coaxial inner conductor 13, but a construction in which a plurality of coaxial inner conductors 13 are alternately arranged with ground plates 15 can also be used.

As described above, according to the high-frequency probe of the present invention, a first effect achieved is that a replacement operation is simple and working hours can be reduced by reducing the number of components that are disassembled at the time of replacing the end part.

Because there are only three components to be disassembled and reassembled, that is, the end unit 10, probe body 20, and pressure block 40, the positioning of these parts can be performed quickly.

Additionally, reproducibility of measurement of the high-frequency characteristics where disassembly and reassembly are performed is high.

Accurate reproducibility of the positions of respective parts upon assembly can be obtained in a short amount of time because the position of the end unit is supported at at least three locations over a wide area, that is, at the end unit support surface 25, at the end unit arrangement surface 26, and at the guide groove 32.

Moreover, the end of the coaxial inner conductor 13, which becomes the central signal conductor 24, securely contacts a signal electrode on the device-under-test, and also ground plates 15 contact at sufficient pressure the device stage which closely contacts and conducts to the backside of the device-under-test which serves as a ground electrode. Thus, the end unit 10 is constructed by arranging the ground plates 15 on both sides of the coaxial inner conductor 13 in the vicinity of the end of the coaxial inner conductor 13, sandwiching the transmission line having a stripline construction, and making the ground plates 15 elastic in construction.

A further effect of the end unit 10 is that excellent high-frequency characteristics can be obtained even if the device-under-test is mounted so that the ground electrode of the device-under-test may conduct to a board, which is larger than the device-under-test and which is grounded across its entire surface, instead of to the device stage, or even if there is no ground electrode adjacent to a signal electrode or the device-under-test.

With the present invention, it is possible to reduce the influence of crosstalk between respective coaxial cables 12 due to the construction of the ground plates 15 sandwiching the coaxial inner conductor 13.

In addition, an additional effect of the end unit 10 is that it is possible to downsize the outside dimension of a device-under-test, since it is unnecessary to position the ground electrodes adjacent to the signal electrodes of the device-under-test.

Furthermore, another effect of the end unit 10 is that it is possible to perform accurate measurement using equivalent characteristic impedance according to equipped conditions of the device-under-test.

This is because the characteristic impedance of the probe end part can be changed by fitting an impedance adjustment member made of metal or a dielectric material and having a pipe-or block-like shape on the exposed end part of the coaxial inner conductor 13, or by changing a gap distance by varying the shape or positioning of ground plates 15 against the coaxial inner conductor 13.

A still further effect of the end unit 10 is to increase the measurement efficiency of a device-under-test having a plurality of electrodes by arranging coaxial cables 12 and ground plates 15 in parallel to form a plurality of probes.

What is claimed is:

1. A high-frequency probe that performs high-frequency measurement by contacting one end part to electrodes of a device-under-test and connecting an opposite end part to an external measuring instrument with electrical conductivity, said high-frequency probe comprising an end unit detachable from the probe, said end unit comprising:

a coaxial inner conductor that has an end part serving as an electrode contacting end part which contacts and electrically conducts to signal electrodes of a device-under-test;

a coaxial outer conductor that encloses a central part of said coaxial inner conductor while leaving said coaxial inner conductor exposed at both ends thereof, and which is flexible in at least a direction of contacting the device-under-test;

a dielectric holding said coaxial inner conductor at a position along a central axis of said coaxial outer conductor;

two ground plates positioned in parallel to said electrode contacting end part on both sides of said coaxial inner conductor, which contact and electrically conduct to the outside of said coaxial outer conductor, and are spaced apart at a sufficient width for positioning said coaxial outer conductor therebetween, each ground plate comprising a branch part having an elastic construction at a central part of said ground plate;

a respective central guide supporting the central part of said each ground plate by contacting said branch part; and a base guide that presses and supports an end part opposite to an end part at which said ground plates contact the device-under-test, wherein said ground plates generate contact pressure against ground electrodes on the device-under test by means of the elastic construction of said branch parts when the corresponding end part of each ground plate contacts the device-under-test.

2. The high-frequency probe as claimed in claim 7, wherein said two ground plates are set so that a predetermined characteristic impedance can be obtained by adjusting a gap between said central signal conductor and said ground plates in a range where said two ground plates run parallel along an exposed part of said coaxial inner conductor including said electrode contacting end part.

3. The high-frequency probe as claimed in claim 2, wherein the gap between said central signal conductor and the ground plates is determined based on the thickness of the ground plates by fixing the distance between the outside surfaces of the two ground plates which run parallel.

4. The high-frequency probe as claimed in claim 1, wherein said ground plates each have a notch at an end part of the ground plate which contacts and electrically conducts to a device stage when a device-under-test is mounted on said device stage which contacts and electrically conducts to a ground electrode of the device-under-test and is measured.

5. The high-frequency probe as claimed in claim 1, further comprising an impedance adjustment member having an internal space in which an exposed part including an electrode contacting end part of said coaxial inner conductor is fitted.

6. The high-frequency probe as claimed in claim 5, wherein said impedance adjustment member has a different length for a parallel direction to said coaxial inner conductor.

7. The high-frequency probe as claimed in claim 5, wherein said impedance adjustment member has a pipe-like shape.

8. The high-frequency probe as claimed in claim 5, wherein said impedance adjustment member has a square column-like shape.

9. The high-frequency probe as claimed in claim 5, wherein said impedance adjustment member is made of metal.

10. The high-frequency probe as claimed in claim 5, wherein said impedance adjustment member is a dielectric having a dielectric constant larger than that of air.

11. The high-frequency probe claimed in claim 1, wherein said coaxial inner conductor, the coaxial outer conductor, and the dielectric form a coaxial cable.

12. The high-frequency probe as claimed in claim 11, further comprising at least other metal ribbons or wires that electrically connect said coaxial outer conductor and said ground plates.

13. The high-frequency probe as claimed in claim 1, wherein said end parts of said two ground plates which contact said ground electrodes of said device-under-test are arranged on approximately the same plane as the electrode contacting end part of said coaxial inner conductor.

14. The high-frequency probe as claimed in claim 12 wherein a plurality of said high-frequency probes are arranged in parallel.

15. A high-frequency probe that performs high-frequency measurement by contacting one end part to electrodes of a device-under-test and by electrically connecting another end part to an external measuring instrument, the electrodes of the device-under-test including a signal electrode and ground electrodes, said high-frequency probe comprising:
- an end unit including a first transmission line which has a first end to be pressed on the signal electrode and the ground electrodes of the device-under-test;
- a probe body which comprises:
  - a second transmission line which is electrically connectable to the external measuring instrument to input/output electric signals on one side thereof and which is electrically connectable to said first transmission line on the other side thereof;
  - an end unit positioning part which is attachable onto a second end of said first transmission line to position said end unit in place; and
  - an end part guide extending from said end unit positioning part in a direction toward the first end of said first transmission line; and
- a pressure block that is detachably fitted to said end unit positioning part to compress said first transmission line of said end unit and to electrically connect said first transmission line to said second transmission line.

16. The high-frequency probe claimed in claim 15, wherein
said end unit further includes
- a contact surface extending transversely to the first transmission line and contacting said probe body, and
- a plane parallel to said first transmission line; and
said end unit positioning part includes
- an end unit support surface that extends transversely to said first transmission line to electrically connect said first transmission line to said second transmission line, and
- an end unit arrangement surface that extends parallel to said first transmission line and that contacts the end unit to the probe body when said end unit is pressed against said probe body by said pressure block.

17. The high-frequency probe claimed in claim 16, wherein
the end unit positioning part further includes at least one positioning pin on the end unit support surface; and
the end unit further includes at least one pin hole into which the at least one positioning pin is fitted.

18. The high-frequency probe claimed in claim 16, wherein
said end unit has a positioning pin projecting from the other end side along the first transmission line; and
said end unit support surface has at least one positioning pin hole which is parallel to said first transmission line and which fits the at least one positioning pin to fix the end unit to the probe body.

19. The high-frequency probe claimed in claim 17, wherein
said end unit positioning part has at least one positioning pin parallel to said first transmission line, in a connection portion of said first transmission line and said second transmission line; and
said end unit has at least one positioning pin hole to be fitted with said one positioning pin which is positioned on the probe body by the use of at least one positioning pin and the end unit arrangement surface.

20. The high-frequency probe claimed in claim 15, wherein said end unit has a plurality of said first transmission lines and said probe body comprises a plurality of said second transmission lines corresponding to said first transmission lines.

21. The high-frequency probe claimed in claim 15, wherein a plurality of said end units are provided each of which supports at least one of said first transmission lines while the probe body has a plurality of said second transmission lines corresponding to the respective first transmission lines of the plurality of the end units.

22. The high-frequency probe claimed in claim 15, wherein said end unit comprises a ground plate that forms a ground line along the first transmission line and that is linearly shaped while the probe body includes an end part guide which has a guide groove for fitting and positioning an end part of said ground plate.

23. A high-frequency probe that performs high-frequency measurement by contacting one end part to electrodes of a device-under-test and connecting an opposite end part to an external measuring instrument with electrical conductivity said high-frequency probe having a detachable end unit, said end unit comprising:
- a needle that is an electrode contacting end part for contacting and providing electrical conduction to signal electrodes of a device-under-test;
- a circuit board that is dielectric and has a signal conductor fixed on its surface and is electrically connected to said needle on one end;
- a signal pin that is electrically connected to another end of said signal conductor;
- two ground plates positioned in parallel to said circuit board and on both sides of said circuit board, each comprising a branch part having an elastic construction at a central part thereof;
- a respective central guide supporting the central part of said each ground plate by contacting said branch part; and
- a base guide that presses and supports said end part opposite said end part at which said ground plates contact the device-under-test,
wherein said ground plates generate contact pressure against ground electrodes by means of the elastic construction of said branch parts when said end of said ground plates contact the device-under test.

* * * * *